(12) United States Patent
Nam et al.

(10) Patent No.: US 10,026,797 B2
(45) Date of Patent: Jul. 17, 2018

(54) ORGANIC LIGHT-EMITTING DIODE DISPLAY HAVING MULTI-MODE CAVITY STRUCTURE

(71) Applicant: LG DISPLAY CO., LTD., Seoul (KR)

(72) Inventors: Kyoungjin Nam, Paju-si (KR);
Yongmin Kim, Anyang-si (KR);
Jeongoh Kim, Goyang-si (KR);
Jungsun Beak, Paju-si (KR); Jeonggi Yun, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 98 days.

(21) Appl. No.: 14/937,376

(22) Filed: Nov. 10, 2015

(65) Prior Publication Data

US 2016/0133681 A1    May 12, 2016

(30) Foreign Application Priority Data

Nov. 10, 2014 (KR) .................. 10-2014-0155730
Oct. 21, 2015 (KR) .................. 10-2015-0146504

(51) Int. Cl.
*H01L 27/32* (2006.01)
*H01L 51/52* (2006.01)
*H01L 51/56* (2006.01)

(52) U.S. Cl.
CPC ........ *H01L 27/3265* (2013.01); *H01L 27/322* (2013.01); *H01L 27/326* (2013.01); *H01L 27/3248* (2013.01); *H01L 27/3258* (2013.01); *H01L 51/5212* (2013.01); *H01L 51/5265* (2013.01); *H01L 51/56* (2013.01); *H01L 2227/323* (2013.01)

(58) Field of Classification Search
None
See application file for complete search history.

(56) References Cited

U.S. PATENT DOCUMENTS

2010/0072882 A1   3/2010   Hwang et al.
2011/0147757 A1   6/2011   Kim et al.

FOREIGN PATENT DOCUMENTS

| CN | 1399504 A | 2/2003 |
| CN | 101595564 A | 12/2009 |
| JP | 2001-282137 A | 10/2001 |
| WO | WO 2008/093583 A1 | 8/2008 |

*Primary Examiner* — Long Pham
(74) *Attorney, Agent, or Firm* — Birch, Stewart, Kolasch & Birch, LLP

(57) ABSTRACT

An organic light-emitting diode (OLED) display can include a substrate configured to have an emission area and a non-emission area defined in the substrate; a thin film transistor disposed in the non-emission area; a first storage capacitor electrode and a second storage capacitor electrode configured to be overlapped in the emission area with a passivation layer interposed between the first and the second storage capacitor electrodes; an overcoat layer configured to cover the thin film transistor and the second storage capacitor electrode; and a first pixel area configured to comprise a first anode electrode and an insulating layer sequentially stacked on the overcoat layer in such a way as to overlap the second storage capacitor electrode and a second anode electrode disposed on the insulating layer and configured to come in contact with the thin film transistor and the first anode electrode.

10 Claims, 25 Drawing Sheets

ORGANIC LIGHT-EMITTING DIODE DISPLAY HAVING MULTI-MODE CAVITY STRUCTURE

CROSS-REFERENCE TO RELATED APPLICATIONS

This application claims priority benefits of Korean Patent Application No. 10-2014-0155730 filed on Nov. 10, 2014 and Korean Patent Application No. 10-2015-0146504 filed on Oct. 21, 2015. The contents of all these applications are incorporated herein by reference for all purposes as if fully set forth herein.

BACKGROUND OF THE INVENTION

Field of the Invention

The present invention relates to an organic light-emitting diode (OLED) display including a multi-mode cavity structure and having an improved light efficiency and color gamut. Furthermore, the present invention relates to an OLED display having an improved aperture ratio by forming a storage capacitor using a transparent conductive material.

Discussion of the Related Art

Recently, a variety of types of flat panel displays capable of reducing weight and volume (that is, the disadvantages of a cathode ray tube) are being developed. Such flat panel displays include a liquid crystal display (LCD), a field emission display (FED), a plasma display panel (PDP), and an electroluminescence (EL) device.

The EL device is basically divided into an inorganic EL device and an OLED device and is a self-emissive device. The EL device has advantages of high response speed, great emission efficiency and brightness, and a wide viewing angle.

FIG. 1 is a diagram showing the structure of an OLED according to the related art. The OLED includes an organic electroluminescence compound layer configured to perform electroluminescence and a cathode electrode and anode electrode configured to face each other with the organic electroluminescence compound layer interposed therebetween, as shown in FIG. 1. The organic electroluminescence compound layer includes a hole injection layer (HIL), a hole transport layer (HTL), an emission layer (EML), an electron transport layer (ETL), and an electron injection layer (EIL).

In such an OLED, excitons are formed in an excitation process in which holes and electrons injected into the anode electrode and the cathode electrode are recombined in the EML, and the OLED emits light due to energy from the excitons. An OLED display displays an image by electrically controlling the amount of light generated from the EML of an OLED, such as that of FIG. 1.

An organic light-emitting diode display (OLEDD) using the characteristics of an OLED, that is, an electroluminescence device, is basically divided into a passive matrix type organic light-emitting diode (PMOLED) display and an active matrix type organic light-emitting diode (AMOLED) display.

The AMOLED display displays an image by controlling an electric current flowing into an OLED using a thin film transistor (hereinafter referred to as a "TFT").

FIG. 2 is an example of an equivalent circuit diagram showing the structure of a single pixel in an OLED display according to the related art. FIG. 3 is a plan view showing the structure of a single pixel in the OLED display according to the related art. FIG. 4 is a cross-sectional view taken along line I-I' of FIG. 3 and shows the structure of an OLED display according to the related art.

Referring to FIGS. 2 and 3, an AMOLED display includes a switching TFT ST, a driving TFT DT connected to the switching TFT ST, and an OLED configured to come in contact with the driving TFT DT.

The switching TFT ST is formed at a portion where a scan line SL and a data line DL are intersected. The switching TFT ST functions to select a pixel. The switching TFT ST includes a gate electrode SG branched from the scan line SL, a semiconductor layer SA, a source electrode SS, and a drain electrode SD. Furthermore, the driving TFT DT functions to drive the OLED of a pixel selected by the switching TFT ST. The driving TFT DT includes a gate electrode DG connected to the drain electrode SD of the switching TFT ST, a semiconductor layer DA, a source electrode DS connected to a driving current line VDD, and a drain electrode DD. The drain electrode DD of the driving TFT DT is connected to the anode electrode ANO of the OLED.

More specifically, referring to FIG. 4, the gate electrodes SG and DG of the switching TFT ST and the driving TFT DT are formed on the substrate SUB of the AMOLED display. Furthermore, a gate insulating layer GI is covered on the gate electrodes SG and DG. The semiconductor layers SA and DA are formed on part of the gate insulating layer GI overlapping the gate electrodes SG and DG. The source electrode SS, DS and the drain electrode SD, DD are formed to face each other at a specific interval on the semiconductor layer SA, DA. The drain electrode SD of the switching TFT ST comes in contact with the gate electrode DG of the driving TFT DT through a contact hole formed in the gate insulating layer GI. A passivation layer PAS configured to cover the switching TFT ST and the driving TFT DT having such a structure is coated on the entire surface.

In particular, if the semiconductor layers SA and DA are made of an oxide semiconductor material, there are advantages in terms of high resolution and high-speed driving in a large-area TFT substrate having a high charging capacity attributable to a high charge mobility characteristic. However, the oxide semiconductor material may further include etch stoppers SE and DE for protecting a top surface from an etchant in order to secure the stability of the device. More specifically, the etch stopper SE, DE is formed to protect the semiconductor layer SA, DA from being etched back by an etchant which comes in contact with a top surface in a portion between the source electrode SS, DS and the drain electrode SD, DD.

A color filter CF is formed in a portion corresponding to the area of the anode electrode ANO to be formed later. The color filter CF may be formed to occupy a wide area, if possible. For example, the color filter CF may be formed to overlap a wide area of the data line DL, the driving current line VDD, and the scan line SL at the front. The substrate in which the color filter CF has been formed as described above does not have a flat surface due to several elements formed therein and has many steps. Accordingly, in order to make flat a surface of the substrate, an overcoat layer OC is coated on the entire surface of the substrate SUB.

Furthermore, the anode electrode ANO of the OLED is formed on the overcoat layer OC. In this case, the anode electrode ANO is connected to the drain electrode DD of the driving TFT DT through a contact hole formed in the overcoat layer OC and the passivation layer PAS.

A bank pattern BN is formed on an area in which the switching TFT ST, the driving TFT DT, and various lines DL, SL, and VDD have been formed in order to define a pixel area over the substrate in which the anode electrode ANO has been formed.

The anode electrode ANO exposed by the bank pattern BN becomes an emission area. An organic light-emitting layer OLE and a cathode electrode layer CAT are sequentially stacked on the anode electrode ANO exposed by the bank pattern BN. If the organic light-emitting layer OLE is made of an organic material that emits white light, it emits light of a color designated to each pixel by the underlying color filter CF. The OLED display having a structure of FIG. 4 is a bottom emission type display device which emits light downwardly.

In such a bottom emission type OLED display, a storage capacitor STG is formed in the space in which the gate electrode DG of the driving TFT DT overlaps the anode electrode ANO. The OLED display displays image information by driving the OLED. Very high energy is required to drive the OLED. Accordingly, a high-capacity storage capacitor is necessary to accurately display image information whose data value is rapidly changed, such as a moving image.

In order to sufficiently secure the size of the storage capacitor, the area of a storage capacitor electrode needs to be sufficiently large. In a bottom emission type OLED display, if the area of the storage capacitor is increased, there is a problem in that an area that emits light, that is, an aperture ratio, is reduced. In a top emission type OLED display, an aperture ratio is not reduced although a high-capacity storage capacitor is designed because the storage capacitor is able to be installed under the emission area. In the bottom emission type OLED display, however, there is a problem in that the area of the storage capacitor is directly related to a reduction of the aperture ratio.

Furthermore, recently, in order to improve light efficiency of an OLED display, an OLED display having a micro-cavity structure is being developed. In such an OLED display having a micro-cavity structure, light efficiency is greatly increased by a resonant effect between electrodes. However, the OLED display having a micro-cavity structure is problematic in that the color viewing angle is reduced because a spectrum bandwidth is very narrow. Accordingly, active research is recently carried out on an OLED display which prevents a reduction of the color viewing angle while improving light efficiency.

SUMMARY OF THE INVENTION

An object of the present invention is to provide an OLED display capable of securing a sufficient storage capacitor without reducing an aperture ratio by forming a storage capacitor using a transparent storage capacitor electrode in an emission area. Another object of the present invention is to provide an OLED display having a multi-mode cavity structure, which generates a dielectric Bragg mirror effect on the upper side and also generates a weak cavity effect on the lower side.

In one aspect, an organic light-emitting diode (OLED) display includes a substrate configured to have an emission area and a non-emission area defined in the substrate; a thin film transistor disposed in the non-emission area; a first storage capacitor electrode and a second storage capacitor electrode configured to be overlapped in the emission area with a passivation layer interposed between the first and the second storage capacitor electrodes; an overcoat layer configured to cover the thin film transistor and the second storage capacitor electrode; and a first pixel area configured to comprise a first anode electrode and an insulating layer sequentially stacked on the overcoat layer in such a way as to overlap the second storage capacitor electrode and a second anode electrode disposed on the insulating layer and configured to come in contact with the thin film transistor and the first anode electrode.

In another aspect, a method of manufacturing an organic light-emitting diode (OLED) display includes a first step of forming a thin film transistor and a first storage capacitor electrode on a substrate; a second step of forming a second storage capacitor electrode overlapping the first storage capacitor electrode with a passivation layer covering the first storage capacitor electrode interposed between the second storage capacitor electrode and the first storage capacitor electrode; a third step of forming a color filter on the second storage capacitor electrode; a fourth step of sequentially forming a first anode electrode and an insulating layer overlapping the second storage capacitor electrode on an overcoat layer covering the color filter and of forming a pixel contact hole exposing a drain electrode of the thin film transistor through the overcoat layer and the passivation layer; and a fifth step of forming a second anode electrode coming in contact with the drain electrode and the first anode electrode and overlapping the first anode electrode with the insulating layer interposed between the second anode electrode and the first anode electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. In describing some embodiments, the same elements are representatively described in connection with a first embodiment and may be omitted in other embodiments.

First Embodiment

Figure 1:
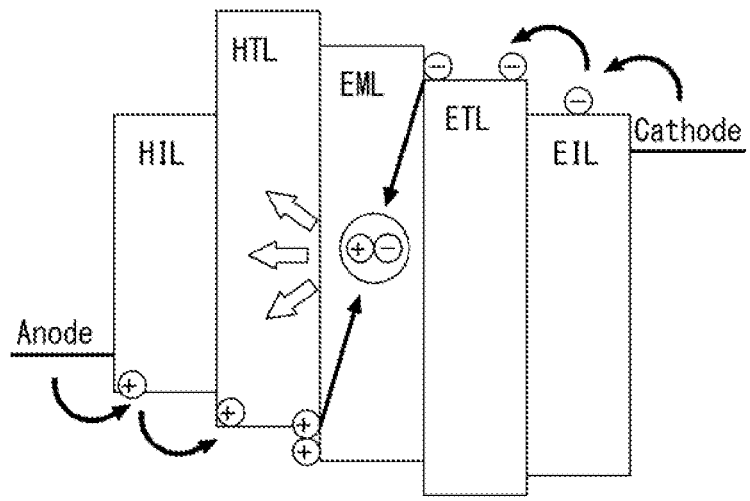
FIG. 1 is a diagram showing an OLED according to the related art.
Figure 2:
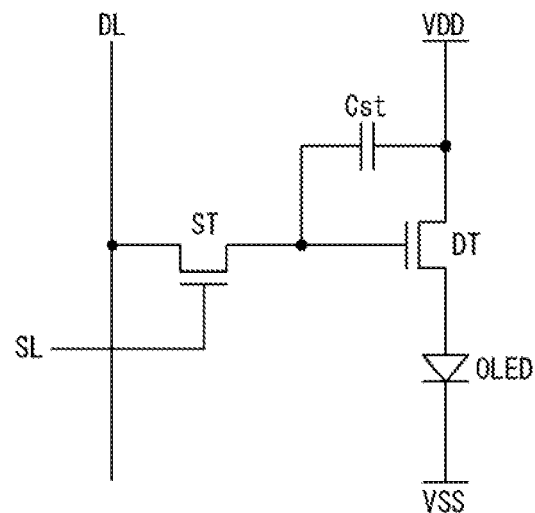
FIG. 2 is an equivalent circuit diagram showing the structure of a single pixel in an OLED display according to the related art.
Figure 3:
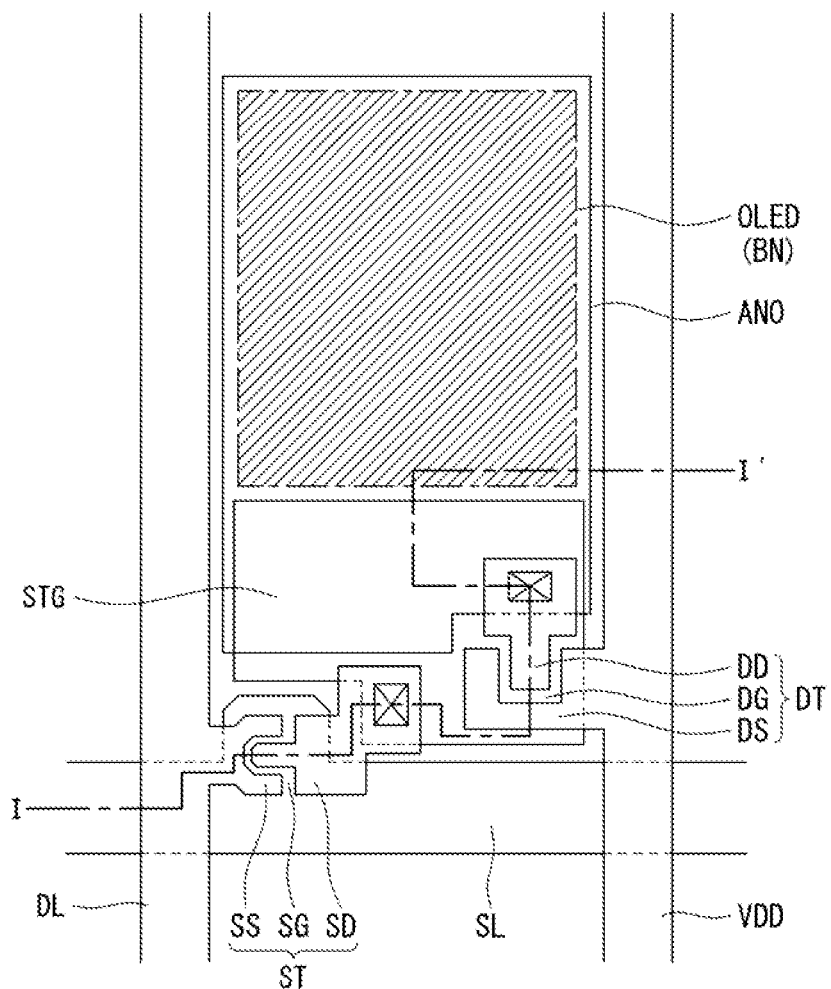
FIG. 3 is a plan view showing the structure of a single pixel in the OLED display according to the related art.
Figure 4:
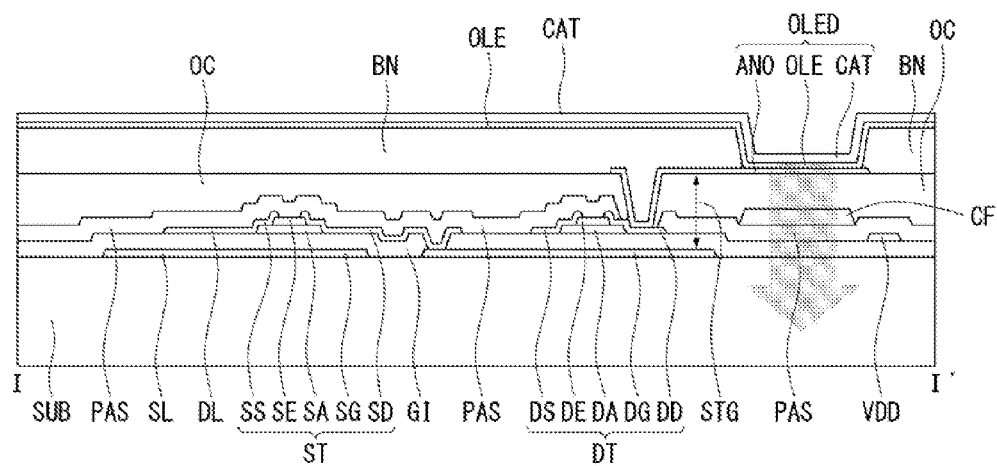
FIG. 4 is a cross-sectional view taken along line I-I' of FIG. 3 and shows the structure of an OLED display according to the related art.
Figure 5:
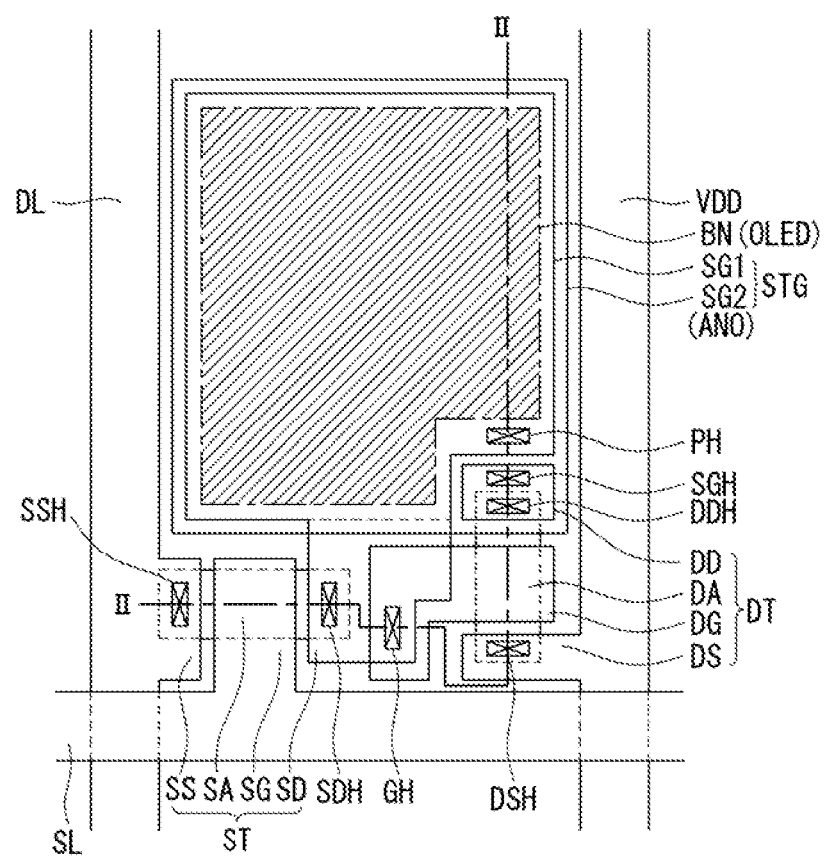
FIG. 5 is a plan view schematically showing the structure of an OLED display according to a first embodiment of the present invention.
Figure 6:
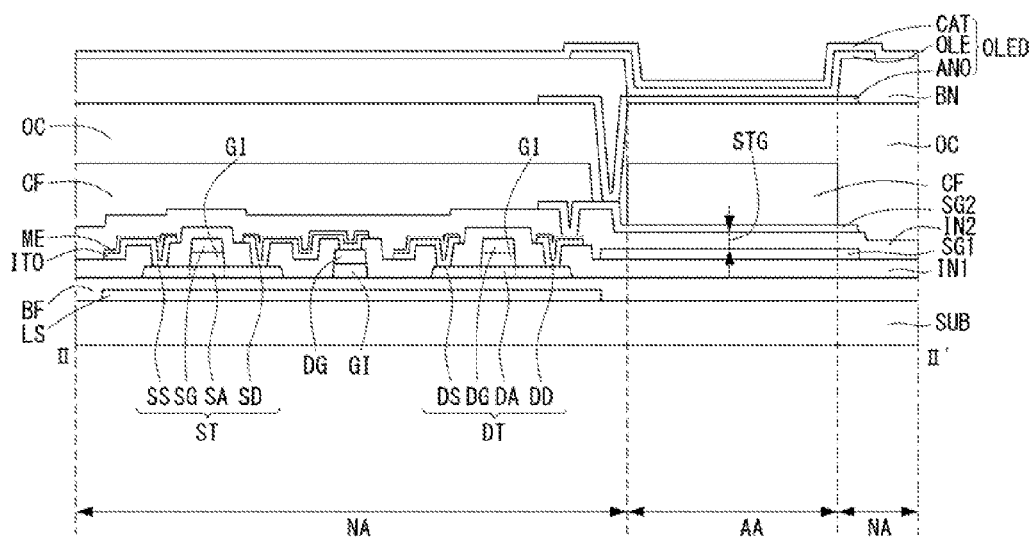
FIG. 6 is a cross-sectional view taken along line II-II' of FIG. 5 and shows a schematic structure of the OLED display according to the first embodiment of the present invention.

An OLED display according to a first embodiment of the present invention is described below with reference to FIGS. 5 and 6. FIG. 5 is a plan view schematically showing the structure of the OLED display according to the first embodiment of the present invention. FIG. 6 is a cross-sectional view taken along line II-II' of FIG. 5 and shows a schematic structure of the OLED display according to the first embodiment of the present invention.

Referring to FIGS. 5 and 6, the OLED display according to the first embodiment of the present invention includes a substrate SUB configured to have an emission area AA and a non-emission area NA defined therein, a switching TFT ST, a driving TFT DT connected to the switching TFT ST, a second storage capacitor electrode SG2 configured to come in contact with the driving TFT DT, a storage capacitor STG formed by the overlapping of the second storage capacitor electrode SG2 and a first storage capacitor electrode SG1, and an OLED connected to the driving TFT DT through the second storage capacitor electrode SG2. The storage capacitor STG and the OLED are formed in the emission area AA, and the TFTs ST and DT or lines SL, DL, and VDD are formed in the non-emission area NA.

The scan line SL and the data line DL are formed on the substrate SUB in a matrix form, thus defining a pixel. The switching TFT ST is formed in an area in which the scan line SL and the data line DL are intersected, and it functions to select a pixel. The switching TFT ST includes a switching gate electrode SG, a channel layer SA, a switching source electrode SS, and a switching drain electrode SD. The switching gate electrode SG is connected to the scan line SL, and the switching source electrode SS branched from the data line DL.

The driving TFT DT includes a driving gate electrode DG, a channel layer DA, a driving source electrode DS, and a driving drain electrode DD. The driving gate electrode DG is connected to the switching drain electrode SD, and the driving source electrode DS branched from the driving current line VDD.

A passivation layer IN2 is formed to cover the source electrodes SS and DS and drain electrodes SD and DD of the TFTs ST and DT and to expose part of the driving drain electrode DD. The second storage capacitor electrode SG2 is formed on the passivation layer IN2 in such a way as to come in contact with part of the driving drain electrode DD. In this case, the second storage capacitor electrode SG2 overlaps the first storage capacitor electrode SG1, simultaneously formed when the source electrodes SS and DS and drain electrodes SD and DD of the respective TFTs ST and DT are formed, with the passivation layer IN2 interposed therebetween, thus forming the storage capacitor STG.

The storage capacitor STG can be formed to have a wide area without a reduction of the aperture ratio in the emission area AA because it is formed by the overlapping of the second storage capacitor electrode SG2 and the first storage capacitor electrode SG1 made of a transparent conductive material. Accordingly, the OLED display according to the first embodiment of the present invention is capable of securing a sufficient storage capacitor STG.

Each color filter CF may be formed on the second storage capacitor electrode SG2 in the emission area AA in such a way as to correspond to each pixel area. Red, green, and blue color filter CFs may be alternately disposed in the color filter CF. The color filter CF may further include a white color filter CF. In this case, the red color filter CF and/or the green color filter CF may also be extended and formed on an area which belongs to the pixel area and in which the TFTs ST and DT have been formed in such a way as to cover the TFTs ST and DT.

An overcoat layer OC configured to expose part of the second storage capacitor electrode SG2 is formed on the entire surface of the substrate SUB in which the color filter CF has been formed. The overcoat layer OC is coated on the entire surface of the substrate SUB in order to make flat a surface of the substrate SUB in which the color filter CF has been formed.

An anode electrode ANO is formed on the overcoat layer OC so that it comes in contact with the second storage capacitor electrode SG2. The anode electrode ANO is electrically connected to the drain electrode DD of the driving TFT through the second storage capacitor electrode SG2.

A bank BN configured to expose part of the anode electrode ANO is formed on the anode electrode ANO. An organic emission layer OLE is formed on part of the anode electrode ANO exposed by the bank BN. A cathode electrode CAT is formed on the organic emission layer OLE in such a way as to cover the organic emission layer OLE. Accordingly, the OLED including the anode electrode ANO, the organic emission layer OLE, and the cathode electrode CAT is completed.

A process of manufacturing the OLED display according to the first embodiment of the present invention is described in detail below with reference to FIGS. 7A to 7J. The characteristics of the OLED display according to the first embodiment of the present invention are described in more detail through the manufacturing process. FIGS. 7A to 7J are cross-sectional views showing the method of manufacturing the OLED display according to the first embodiment of the present invention.

Figure 7A:
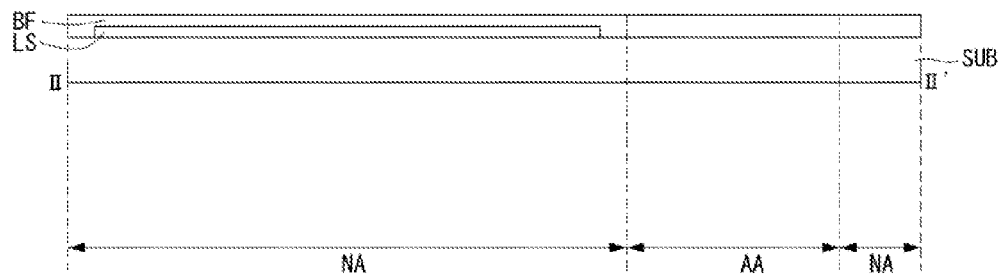
FIGS. 7A to 7J are cross-sectional views showing a method of manufacturing the OLED display according to the first embodiment of the present invention.

Referring to FIG. 7A, an opaque metal material is coated on the entire surface of the substrate SUB. A light-shield layer LS is formed by patterning the metal material using a first mask process. The light-shield layer LS may be formed to overlap the semiconductor layers of TFT to be formed later, in particular, channel layers. The light-shield layer LS functions to protect an oxide semiconductor device against external light. An insulating material is coated on the entire surface of the substrate SUB on which the light-shield layer LS has been formed, thus forming a buffer layer BF.

Figure 7B:
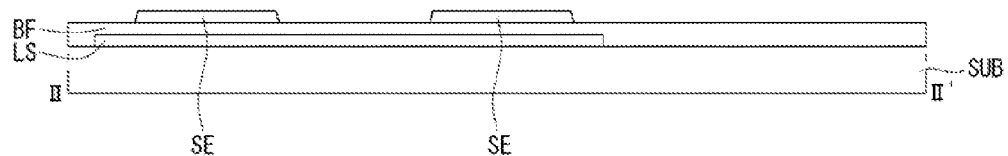

Referring to FIG. 7B, a semiconductor material is coated on the entire surface of the substrate SUB on which the buffer layer BF has been formed. The semiconductor material may include an oxide semiconductor material, such as indium gallium zinc oxide (IGZO). Semiconductor layers SE are formed by patterning the semiconductor material using a second mask process.

Figure 7C:
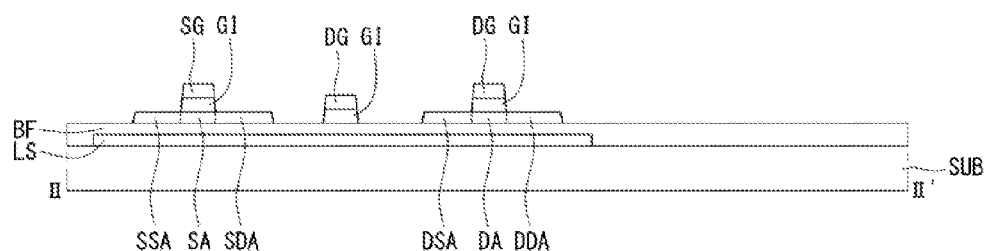

Referring to FIG. 7C, an insulating material and a metal material are continuously coated on the entire surface of the substrate SUB in which the semiconductor layers SE have been formed. Gate insulating layers GI and the gate electrodes SG and DG overlapping the gate insulating layers GI are formed by simultaneously patterning the insulating material and the metal material using a third mask process. The gate electrodes SG and DG may be formed to overlap the central areas of the semiconductor layers SE and to expose both sides of the semiconductor layers SE. The central areas of the semiconductor layers SE are respectively defined as the channel layer SA of the switching TFT and the channel layer DA of the driving TFT. The exposed semiconductor layers SE become source areas SSA and DSA and drain areas SDA and DDA respectively coming in contact with the source-drain electrodes of the switching TFT and the driving TFT. If the semiconductor material is an oxide semiconductor material, the source areas SSA and DSA and the drain areas SDA and DDA may be conductorized by a plasma processing process.

Figure 7D:
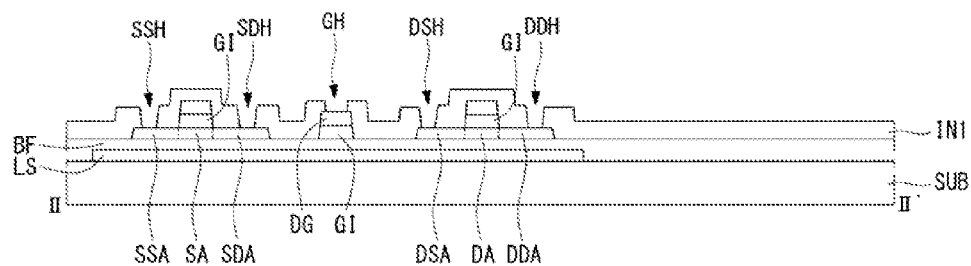

Referring to FIG. 7D, an interlevel insulating layer IN1 is formed on the entire surface of the substrate SUB in which the gate electrodes SG and DG have been formed by coating an insulating material. Contact holes SSH and DSH through which the source areas SSA and DSA of the semiconductor layer SE are exposed and contact holes SDH and DDH through which the drain areas SDA and DDA of the semiconductor layer SE are exposed are formed by patterning the interlevel insulating layer IN1 using a fourth mask process. At this time, a gate contact hole GH through which part of the gate electrode DG of the driving TFT is exposed is also formed.

Figure 7E:
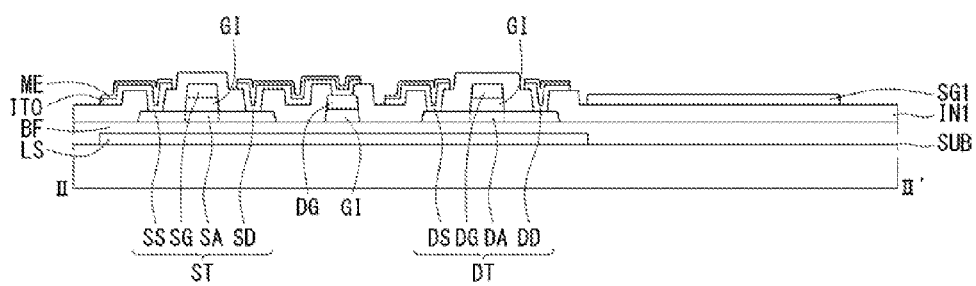

Referring to FIG. 7E, a transparent conductive material and a metal material are continuously coated on the interlevel insulating layer IN1 in which the contact holes have been formed. The transparent conductive material may be a material, such as indium tin oxide, indium zinc oxide, or indium tin zinc oxide. The source electrode SS and drain electrode SD of the switching TFT ST and the source electrode DS and drain electrode DD of the driving TFT DT are formed by patterning the transparent conductive material and the metal material using a fifth mask process. The first storage capacitor electrode SG1 made of only a transparent conductive material is formed in the emission area AA. In this case, the drain electrode SD of the switching TFT is connected to the gate electrode DG of the driving TFT.

The fifth mask process is performed using a half-tone mask. Each of the source electrode SS and drain electrode SD of the switching TFT ST and the source electrode DS and drain electrode DD of the driving TFT DT is formed of a dual layer including the transparent conductive material ITO and the metal material ME, and the first storage capacitor electrode SG1 is formed of a single layer including the transparent conductive material ITO, using the half-tone mask. The source electrode SS, DS and drain electrode SD, DD of the TFT ST, DT may be formed of a single layer including the transparent conductive material ITO, but may be formed of a dual layer in which the transparent conductive material ITO and the metal material ME have been stacked by taking into consideration high sheet resistance of the transparent conductive material ITO.

Figure 7F:
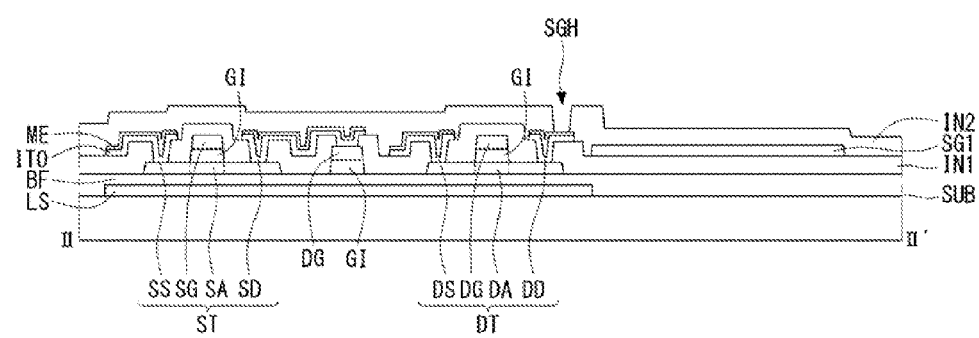

Referring to FIG. 7F, the passivation layer IN2 is formed by coating an insulating material on the entire surface of the substrate SUB in which the TFTs ST and DT have been completed. a storage capacitor contact hole SGH is formed by patterning the passivation layer IN2 using a sixth mask process.

Figure 7G:
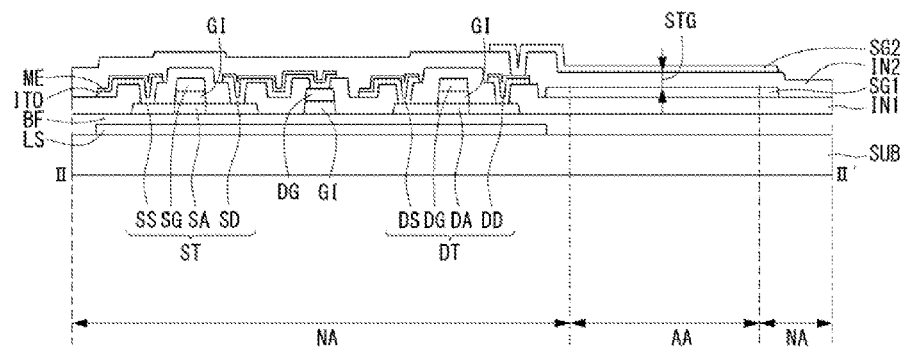

Referring to FIG. 7G, a transparent conductive material is coated on the entire surface of the substrate SUB in which the storage capacitor contact hole SGH has been formed. The second storage capacitor electrode SG2 is formed by patterning the transparent conductive material using a seventh mask process. The second storage capacitor electrode SG2 may be formed to overlap the first storage capacitor electrode SG1. The second storage capacitor electrode SG2 comes in contact with the drain electrode DD of the driving TFT DT through the storage capacitor contact hole SGH.

In this case, in the emission area AA, the first storage capacitor electrode SG1 and the second storage capacitor electrode SG2 are formed to overlap each other with the passivation layer IN2 interposed therebetween. The storage capacitor STG is formed in the area in which the first storage capacitor electrode SG1 and the second storage capacitor electrode SG2 overlap each other. Accordingly, in the OLED display according to the first embodiment of the present invention, the storage capacitor electrodes SG1 and SG2 can be formed in the entire emission area AA without a reduction of the aperture ratio because the storage capacitor electrodes SG1 and SG2 are formed using the transparent conductive material. Accordingly, the OLED display according to the first embodiment of the present invention can secure a sufficient storage capacitor STG because the storage capacitor STG having a wide area can be formed.

Figure 7H:
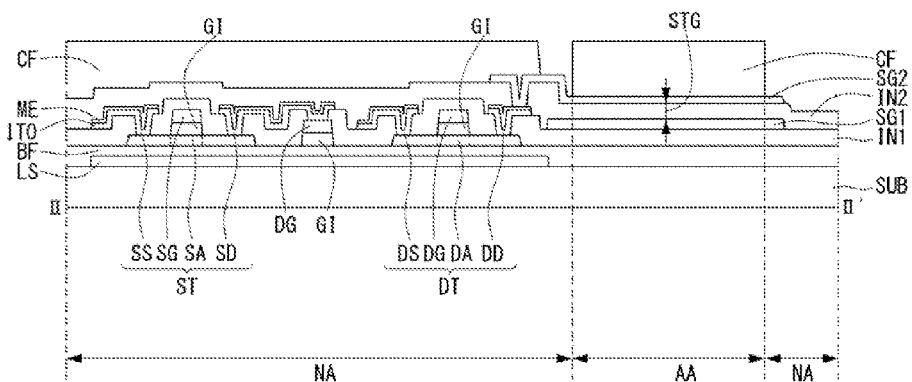

Referring to FIG. 7H, red, green, and blue pigments are coated on the entire surface of the substrate SUB in which the second storage capacitor electrode SG2 has been formed. Red, green, and blue color filters CF are sequentially formed by sequentially patterning the red, green, and blue pigments using respective eighth, ninth, and tenth mask processes. The red, green, and blue color filters CF are selectively formed in a pixel area in which red, green, and blue are respectively to be displayed. In this case, the red color filter CF and/or the green color filter CF may be extended and formed to cover the TFTs ST and DT of the pixel area.

Figure 7I:
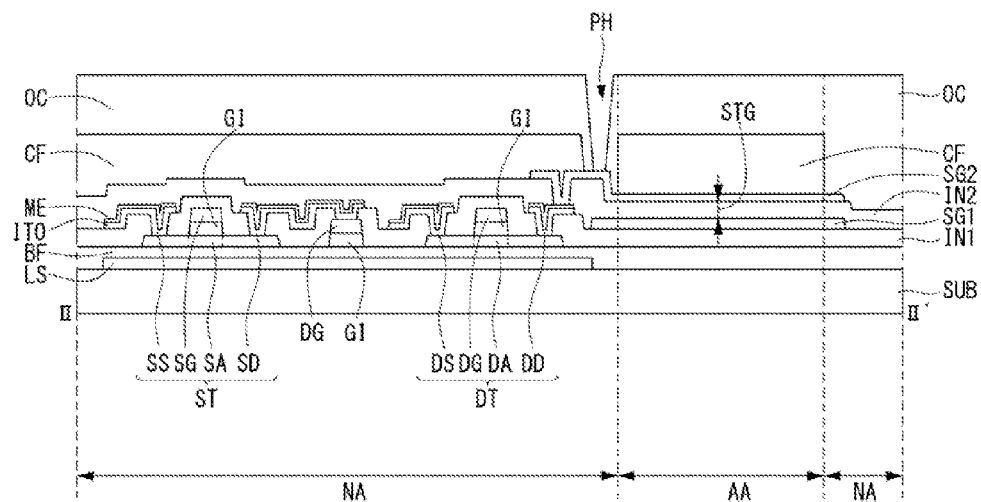

Referring to FIG. 7I, the overcoat layer OC is formed by coating an insulating material on the entire surface of the substrate SUB in which the color filter CF has been formed. A pixel contact hole PH is formed by patterning the overcoat layer OC using an eleventh mask process.

Figure 7J:
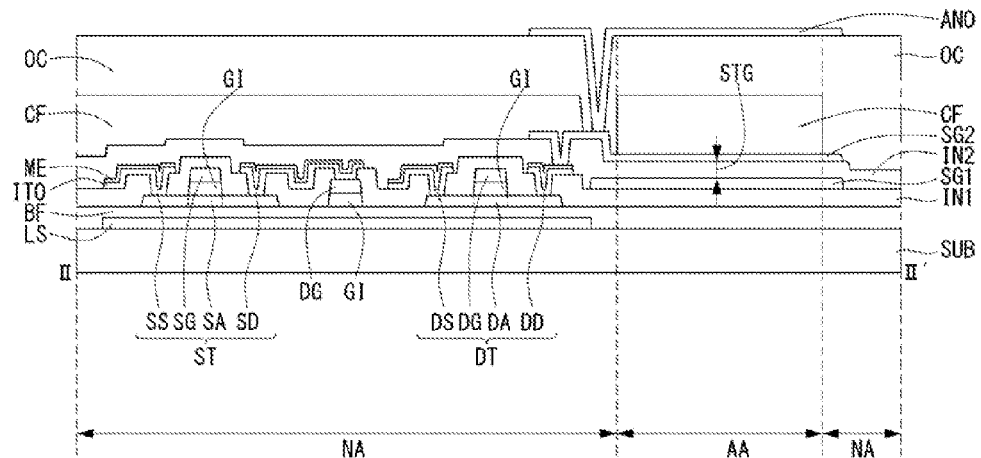

Referring to FIG. 7J, a transparent conductive material is coated on the entire surface of the substrate SUB in which the pixel contact hole PH has been formed. The anode electrode ANO is formed by patterning the transparent conductive material using a twelfth mask process. The anode electrode ANO comes in contact with the second storage capacitor electrode SG2 through the pixel contact hole PH. Furthermore, the anode electrode ANO is also electrically connected to the drain electrode DD of the driving TFT through the second storage capacitor electrode SG2.

Next, referring back to FIG. 6, an insulating material is coated on the entire surface of the substrate SUB in which the anode electrode ANO has been formed, and the bank BN is formed by patterning the insulating material. The bank BN defines an open area that will actually become the emission area AA and may have a shape which opens an area that belongs to the anode electrode ANO and that will emit light. The organic emission layer OLE is formed to cover the anode electrode ANO open by the bank BN. The cathode electrode CAT is formed on the entire surface of the substrate SUB including the organic emission layer OLE. Accordingly, the OLED, including the anode electrode ANO, the organic emission layer OLE, and the cathode electrode CAT, is completed.

The OLED display according to the first embodiment of the present invention can secure a sufficient storage capacitor STG because the first storage capacitor electrode SG1 and the second storage capacitor electrode SG2 can be formed to have a wide area without a reduction of the aperture ratio in the emission area AA. As a result, if the driving TFT DT is an off state, the OLED display can maintain pixel data until a next period using charges charged in the sufficiently secured storage capacitor STG.

Second Embodiment

The second embodiment of the present invention provides an OLED display having an improved light efficiency and color gamut without adding a mask process compared to the first embodiment in forming a storage capacitor using transparent storage capacitor electrodes. That is, the second embodiment of the present invention may provide an OLED display having an improved light efficiency and color gamut without a reduction of the color viewing angle in such a manner that a dielectric Bragg mirror effect is generated by sequentially stacking a first anode electrode, an insulating layer, and a second anode electrode having different refractive indices and a weak cavity effect is also generated by forming a first storage capacitor electrode and a second storage capacitor electrode with a passivation layer interposed therebetween. A structure in which a dielectric Bragg mirror effect is generated on the upper side of the OLED display and a weak cavity effect is simultaneously generated on the lower side of the OLED display is defined as a multi-mode cavity structure. The second embodiment of the present invention provides an OLED display having such a multi-mode cavity structure.

Figure 8:
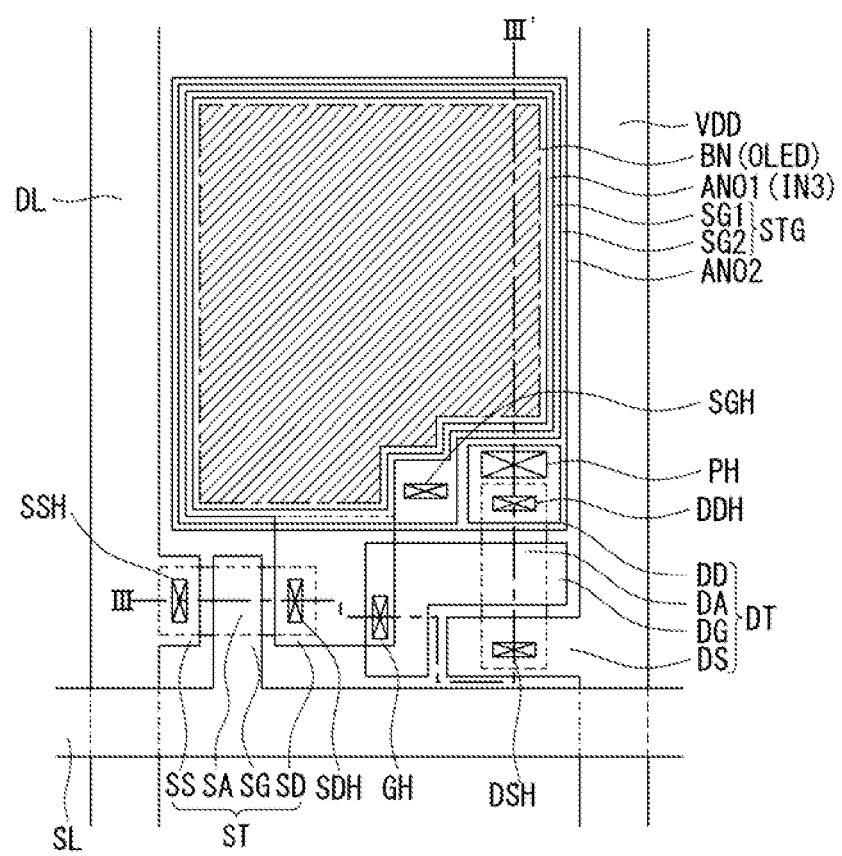
FIG. 8 is a plan view schematically showing the structure of an OLED display according to a second embodiment of the present invention.
Figure 9:
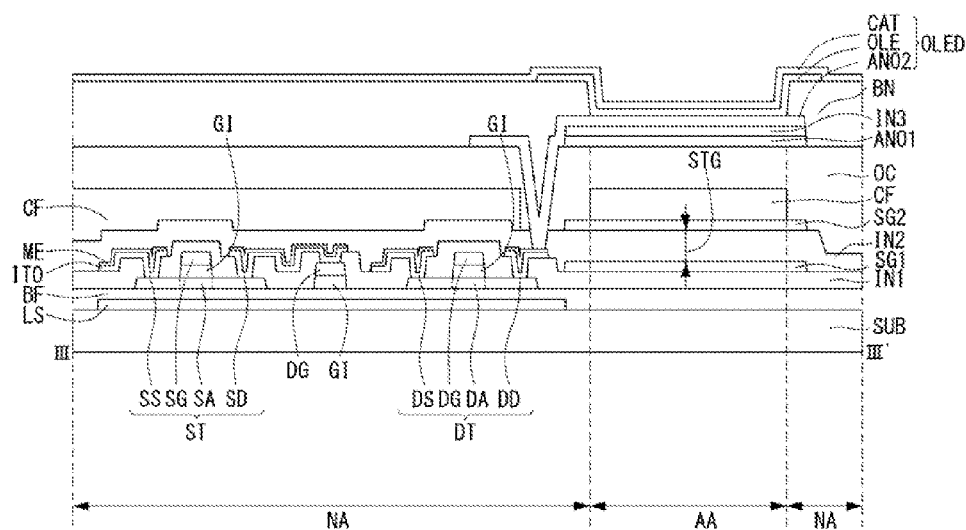
FIG. 9 is a cross-sectional view taken along line III-III' of FIG. 8 and shows the structure of the OLED display according to the second embodiment of the present invention.

The OLED display according to the second embodiment of the present invention is described below with reference to FIGS. 8 and 9. FIG. 8 is a plan view schematically showing the structure of the OLED display according to the second embodiment of the present invention. FIG. 9 is a cross-sectional view taken along line III-III' of FIG. 8 and shows the structure of the OLED display according to the second embodiment of the present invention.

Referring to FIGS. 8 and 9, the OLED display according to the second embodiment of the present invention includes a substrate SUB configured to have an emission area AA and a non-emission area NA defined therein, a switching TFT ST, a driving TFT DT connected to the switching TFT ST, a first storage capacitor electrode SG1 connected to the switching TFT ST, a storage capacitor STG formed by the overlapping of the first storage capacitor electrode SG1 and a second storage capacitor electrode SG2, and an OLED connected to the driving TFT DT. The storage capacitor STG and the OLED are formed in the emission area AA. The TFTs ST and DT or lines SL, DL, and VDD are formed in the non-emission area NA.

The scan line SL and the data line DL are formed on the substrate SUB in a matrix form, thus defining a pixel. The switching TFT ST is formed in an area in which the scan line SL and the data line DL are intersected, and it functions to select a pixel. The switching TFT ST includes a switching gate electrode SG, a channel layer SA, a switching source electrode SS, and a switching drain electrode SD. The switching gate electrode SG branched from the scan line SL, and the switching source electrode SS branched from the data line DL.

The driving TFT DT includes a driving gate electrode DG, a channel layer DA, a driving source electrode DS, and a driving drain electrode DD. The driving gate electrode DG is connected to the switching drain electrode SD, and the driving source electrode DS branched from the driving current line VDD.

A passivation layer IN2 configured to cover the source electrodes SS and DS and drain electrodes SD and DD of the TFTs ST and DT is formed. The second storage capacitor electrode SG2 coming in contact with the second anode electrode ANO2 through a storage capacitor contact hole SGH is formed on the passivation layer IN2. In this case, the second storage capacitor electrode SG2 overlaps the first storage capacitor electrode SG1 simultaneously formed when the source electrodes SS and DS and drain electrodes SD and DD of the TFTs ST and DT are formed, with the passivation layer IN2 interposed therebetween, thereby forming the storage capacitor STG. The first storage capacitor electrode SG1 is connected to the drain electrode SD of the switching TFT ST.

The storage capacitor STG may be formed to have a wide area without a reduction of the aperture ratio in the emission area AA because the second storage capacitor electrode SG2 and the first storage capacitor electrode SG1 made of the transparent conductive material are formed to overlap each other. Accordingly, the OLED display according to the second embodiment of the present invention can secure a sufficient storage capacitor STG.

Furthermore, the OLED display according to the second embodiment of the present invention can improve emission efficiency because the constructive interference and/or destructive interference of light is generated between the first storage capacitor electrode SG1 and the second storage capacitor electrode SG2. That is, in the OLED display according to the second embodiment of the present invention, the first storage capacitor electrode SG1, the passivation layer IN2, and the second storage capacitor electrode SG2 are sequentially stacked. The refractive index of at least any one of the first storage capacitor electrode SG1, the passivation layer IN2, and the second storage capacitor electrode SG2 is different from a refractive index of another of the first storage capacitor electrode SG1, the passivation layer IN2, and the second storage capacitor electrode SG2. Accordingly, emission efficiency and color purity can be improved through a light amplification phenomenon (weak cavity) between the layers.

Each color filter CF may be disposed on the second storage capacitor electrode SG2 in the emission area AA so that it corresponds to each pixel area. The color filter CF may have red, green, and blue color filter CF alternately disposed therein and may further include a white color filter CF. In this case, the red color filter CF and/or the green color filter CF may be extended and formed in an area that belongs to the pixel area and in which the TFTs ST and DT have been formed in such a way as to cover the TFTs ST and DT.

An overcoat layer OC is formed on the entire surface of the substrate SUB in which the color filter CF has been formed. The overcoat layer OC is coated on the entire surface of the substrate SUB in order to make flat a surface of the substrate SUB in which the color filter CF has been formed.

A first anode electrode ANO1 and an insulating layer IN3 are sequentially formed on the overcoat layer OC so that they overlap in the emission area AA. A second anode electrode ANO2 is formed on the insulating layer IN3 and the overcoat layer OC, and it comes in contact with the drain electrode DD of the driving TFT DT through a pixel contact hole PH formed to penetrate the overcoat layer OC and the passivation layer IN2. In this case, the second anode electrode ANO2 may come in contact with the first anode electrode ANO1. In the drawings, a structure in which a pair of the first anode electrode ANO1 and the insulating layer IN3 has been formed has been illustrated, but one or more pairs of the first anode electrode ANO1 and the insulating layer IN3 may be stacked. That is, in the second embodiment of the present invention, a plurality of the first anode electrodes ANO1 and the insulating layers IN3 may be included. In this case, the plurality of first anode electrodes ANO1 and insulating layers IN3 are alternately stacked.

In the OLED display according to the second embodiment of the present invention, a dielectric Bragg mirror effect is generated because two or more layers made of materials having different refractive indices are alternately stacked. That is, in the second embodiment of the present invention, the first anode electrode ANO1, the insulating layer IN3, and the second anode electrode ANO2 are sequentially stacked, and constructive interference and destructive interference are generated between the layers. In this case, the refractive index of at least any one of the first anode electrode ANO1, the insulating layer IN3, and the second anode electrode ANO2 is different from a refractive index of another of the first anode electrode ANO1, the insulating layer IN3, and the second anode electrode ANO2. Accordingly, in the second embodiment of the present invention, although a resonant thickness suitable for a red, green, and blue or white wavelength is not formed, light efficiency of the entire wavelength band of red, green, and blue or white and the color gamut can be improved by a difference between the refractive indices of the first anode electrode ANO1, the insulating layer IN3, and the second anode electrode ANO2 and the reflection and concentration of light thereof.

Furthermore, the second embodiment of the present invention may provide the OLED display having improved light efficiency without a reduction of the color viewing angle because the bandwidth of a spectrum is not narrowed unlike in a resonant effect according to a micro cavity using a dielectric Bragg mirror effect.

The OLED display according to the second embodiment of the present invention includes a plurality of the pixel areas. The plurality of pixel areas may include first pixel areas arranged in a matrix form, each having a structure in which the first anode electrode ANO1 and the insulating layer IN3 have been stacked. In some embodiments, the plurality of pixel areas may include the first pixel areas and second pixel areas arranged in a matrix form. In this case, the second pixel area does not have the structure in which the first anode electrode ANO1 and the insulating layer IN3 have been stacked. That is, the first anode electrode ANO1 and the insulating layer IN3 may be selectively formed only part of the pixel area.

For example, the first anode electrode ANO1 and the insulating layer IN3 may be selectively formed only in a pixel area which requires an improved light efficiency and color gamut. That is, the first anode electrode ANO1 and the insulating layer IN3 may be formed only in red pixel areas so that red having a light efficiency and color gamut improved by a dielectric Bragg mirror effect is displayed.

In this case, each of the first anode electrode ANO1 and the second anode electrode ANO2 may have a thickness of 50 Å~2000 Å. The insulating layer IN3 interposed between the first anode electrode ANO1 and the second anode electrode ANO2 may have a thickness of 100 Å~5000 Å.

A bank BN configured to expose part of the second anode electrode ANO2 is formed on the second anode electrode ANO2. The organic emission layer OLE is formed on part of the second anode electrode ANO2 exposed by the bank BN. A cathode electrode CAT is formed on the organic emission layer OLE in such a way as to cover the organic emission layer OLE. Accordingly, the OLED, including the second anode electrode ANO2, the organic emission layer OLE, and the cathode electrode CAT, is completed.

As described above, the OLED display according to the second embodiment of the present invention has a multi-mode cavity structure in which a dielectric Bragg mirror effect is generated on the upper side and at the same time a weak cavity effect is generated on the lower side. Accordingly, the second embodiment of the present invention may provide the OLED display having an improved light efficiency and color gamut while preventing a reduction of the color viewing angle.

A process of manufacturing the OLED display according to the second embodiment of the present invention is described in detail below with reference to FIGS. 10A to 10J. The characteristics of the OLED display according to the second embodiment of the present invention are described in more detail through the manufacturing process. FIGS. 10A to 10J are cross-sectional views showing the method of manufacturing the OLED display according to the second embodiment of the present invention.

Figure 10A:
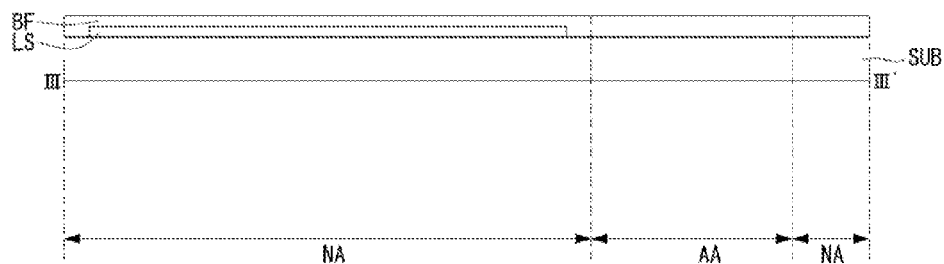
FIGS. 10A to 10J are cross-sectional views showing a method of manufacturing the OLED display according to the second embodiment of the present invention.

Referring to FIG. 10A, an opaque metal material is coated on the entire surface of the substrate SUB. A light-shield layer LS is formed by patterning the metal material using a first mask process. The light-shield layer LS may be formed to overlap the semiconductor layers of TFTs to be described later, in particular, channel layers. The light-shield layer LS functions to protect an oxide semiconductor device against external light. A buffer layer BF is formed by coating an insulating material on the entire surface of the substrate SUB on which the light-shield layer LS has been formed.

Figure 10B:
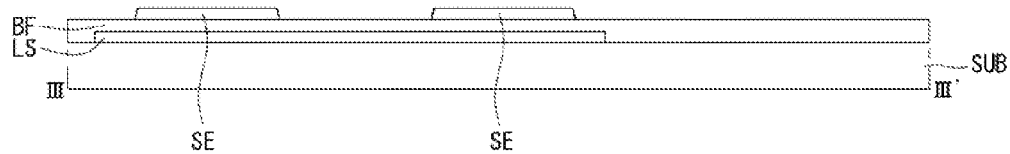

Referring to FIG. 10B, a semiconductor material is coated on the entire surface of the substrate SUB on which the buffer layer BF has been formed. The semiconductor material may include an oxide semiconductor material, such as indium gallium zinc oxide (IGZO). Semiconductor layers SE are formed by patterning the semiconductor material using a second mask process.

Figure 10C:
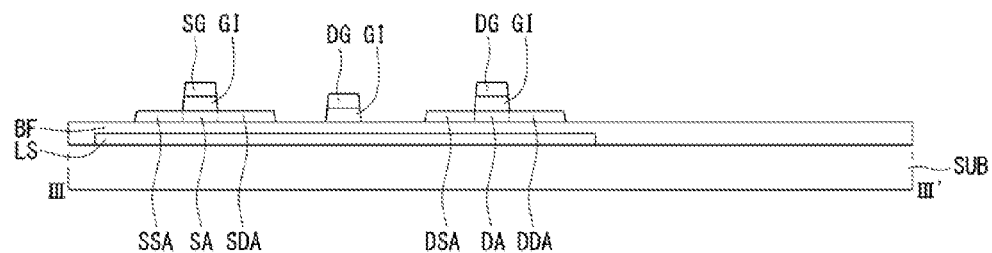

Referring to FIG. 10C, an insulating material and a metal material are continuously coated on the entire surface of the substrate SUB in which the semiconductor layers SE have been formed. Gate insulating layers GI and gate electrodes SG and DG overlapping the gate insulating layers GI are formed by simultaneously pattering the insulating material and the metal material using a third mask process. The gate electrodes SG and DG may be formed to overlap the central areas of the semiconductor layers SE and to expose both sides of the semiconductor layers SE. The central areas of the semiconductor layers SE are respectively defined as the channel layer SA of the switching TFT and the channel layer DA of the driving TFT. The exposed semiconductor layers SE become source areas SSA and DSA and drain areas SDA and DDA coming in contact with the source and drain electrodes of the switching TFT and the driving TFT. If the semiconductor material is an oxide semiconductor material, the source areas SSA and DSA and the drain areas SDA and DDA may be conductorized using a plasma processing process.

Figure 10D:
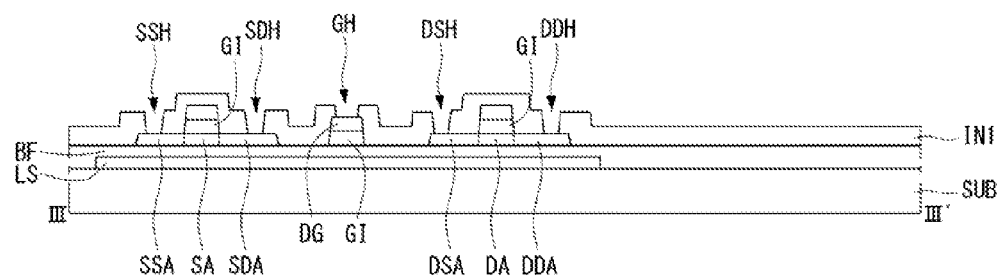

Referring to FIG. 10D, the interlevel insulating layer IN1 is formed by coating an insulating material on the entire surface of the substrate SUB in which the gate electrodes SG and DG have been formed. Contact holes SSH and DSH through which the source areas SSA and DSA of the semiconductor layer are exposed and contact holes SDH and DDH through which the drain areas SDA and DDA of the semiconductor layer are exposed are formed by patterning the interlevel insulating layer IN1 using a fourth mask process. In this case, a gate contact hole GH through which part of the gate electrode DG of the driving TFT is exposed is also formed.

Figure 10E:
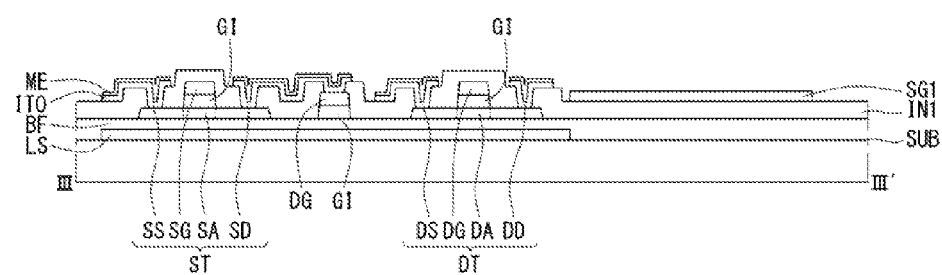

Referring to FIG. 10E, a transparent conductive material and a metal material are continuously coated on the interlevel insulating layer IN1 in which the contact holes have been formed. The transparent conductive material may be a material, such as indium tin oxide, indium zinc oxide, or indium tin zinc oxide. The source electrode SS and drain electrode SD of the switching TFT ST and the source electrode DS and drain electrode DD of the driving TFT DT are formed by pattering the transparent conductive material and the metal material using a fifth mask process. The first storage capacitor electrode SG1 made of only the transparent conductive material is formed in the emission area AA. In this case, the first storage capacitor electrode SG1 is electrically connected to the drain electrode SD of the switching TFT. Furthermore, the drain electrode SD of the switching TFT is connected to the gate electrode DG of the driving TFT.

The fifth mask process is performed using a half-tone mask. Each of the source electrode SS and drain electrode SD of the switching TFT ST and the source electrode DS and drain electrode DD of the driving TFT DT is formed of a dual layer including the transparent conductive material ITO and the metal material ME, and the first storage capacitor electrode SG1 is formed of a single layer including the transparent conductive material ITO, using the half-tone mask. The source electrode SS, DS and the drain electrode SD, DD of the TFTs ST and DT may be formed of a single layer including the transparent conductive material ITO, but may be formed of a dual layer in which the transparent conductive material ITO and the metal material ME have been stacked by taking into consideration high sheet resistance of the transparent conductive material ITO.

Figure 10F:
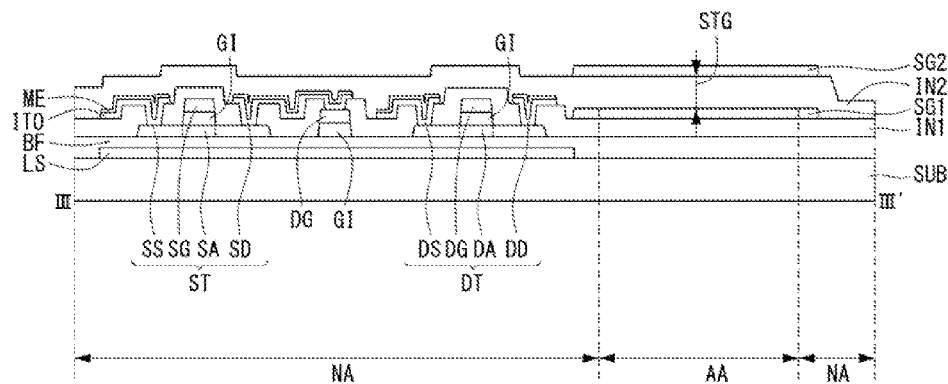

Referring to FIG. 10F, the passivation layer IN2 is formed by coating an insulating material on the entire surface of the substrate SUB in which the TFTs ST and DT have been formed. Next, a transparent conductive material is coated on the passivation layer IN2. The second storage capacitor electrode SG2 is formed by patterning the transparent conductive material using a sixth mask process. The second storage capacitor electrode SG2 is formed to overlap the first storage capacitor electrode SG1.

In this case, the first storage capacitor electrode SG1 and the second storage capacitor electrode SG2 are formed to overlap each other with the passivation layer IN2 interposed therebetween in the emission area AA. The storage capacitor STG is formed in the area in which the first storage capacitor electrode SG1 and the second storage capacitor electrode SG2 are overlapped. Accordingly, in the OLED display according to the second embodiment of the present invention, the storage capacitor electrodes SG1 and SG2 can be formed in the entire emission area AA without a reduction of the aperture ratio because the storage capacitor electrodes SG1 and SG2 are made of the transparent conductive material. Accordingly, the OLED display according to the second embodiment of the present invention can secure a sufficient storage capacitor STG because the storage capacitor STG having a wide area can be formed.

Furthermore, the OLED display according to the second embodiment of the present invention can improve emission efficiency because the constructive interference and/or destructive interference of light are generated between the first storage capacitor electrode SG1 and the second storage capacitor electrode SG2. That is, in the OLED display according to the second embodiment of the present invention, the first storage capacitor electrode SG1 the passivation layer IN2, and the second storage capacitor electrode SG2 are sequentially stacked. The refractive index of at least any one of the first storage capacitor electrode SG1, the passivation layer IN2, and the second storage capacitor electrode SG2 is different from a refractive index of another of the first storage capacitor electrode SG1, the passivation layer IN2, and the second storage capacitor electrode SG2. Accordingly, emission efficiency and color purity can be improved through a light amplification phenomenon (weak cavity) according to resonance between the layers.

Figure 10G:
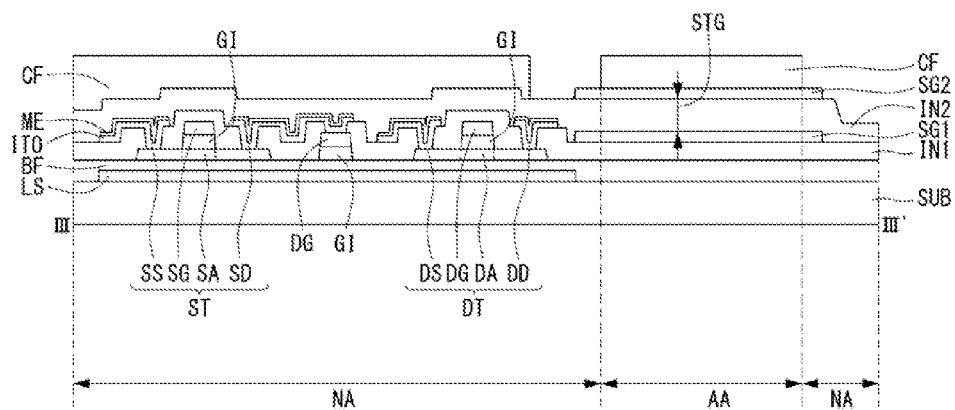

Referring to FIG. 10G, red, green, and blue pigments are coated on the entire surface of the substrate SUB in which the second storage capacitor electrode SG2 has been formed. The red, green, and blue color filters CF are sequentially formed by sequentially patterning the red, green, and blue pigments using respective seventh, eighth, and ninth mask processes. The red, green, and blue color filters CF are selectively formed in a pixel area in which red, green, and blue are respectively to be displayed. In this case, the red color filter CF and/or the green color filter CF may be extended and formed so that they cover the TFTs ST and DT of the pixel area.

Figure 10H:
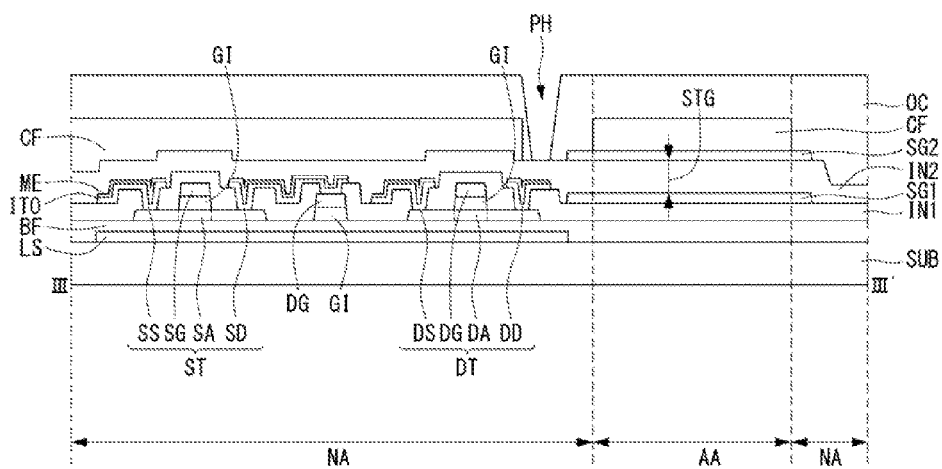

Referring to FIG. 10H, the overcoat layer OC is formed by coating an insulating material on the entire surface of the substrate SUB in which the color filter CF has been formed. The pixel contact hole PH through which part of the passivation layer IN2 is exposed is formed by patterning the overcoat layer OC using a tenth mask process. In this case, although not shown in the cross-sectional views, a storage capacitor contact hole SGH (refer to FIG. 8) through which part of the second storage capacitor electrode SG2 is exposed is formed along with the pixel contact hole PH.

Figure 10I:
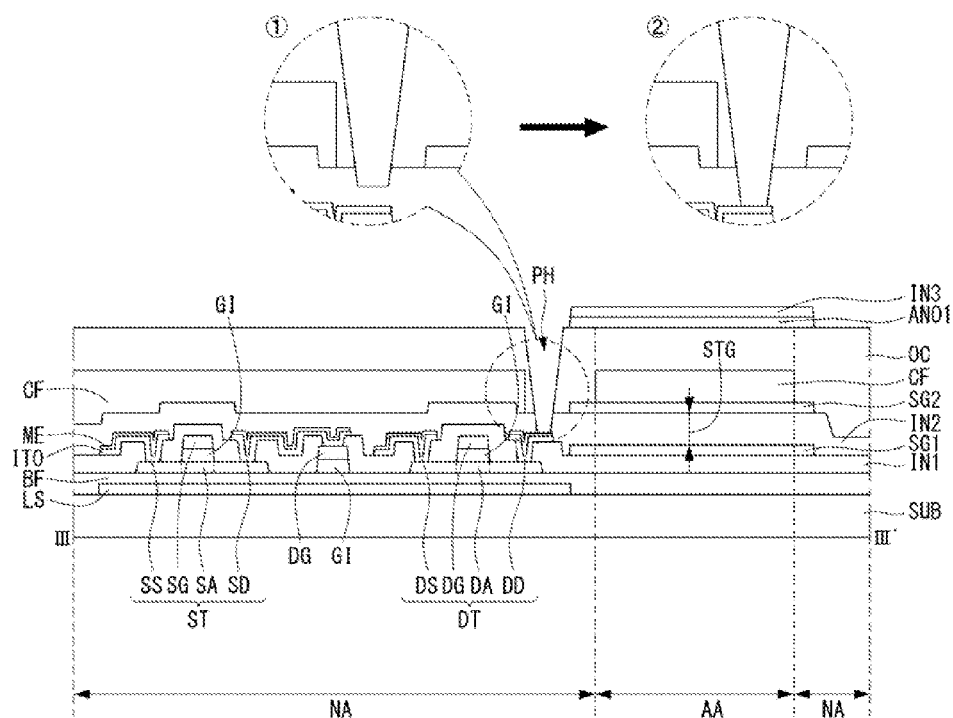

Referring to FIG. 10I, a transparent conductive material and an insulating material are continuously coated on the overcoat layer OC in which the pixel contact hole PH has been formed. The insulating material may include an inorganic insulating material, such as silicon oxide ($SiO_2$), silicon nitride ($SiN_x$), or silicon oxynitride (SiON), but the present invention is not limited thereto. For example, the insulating material may include all types of insulating materials formed by a CVD process using $SiH_4$, $NH_3$, $N_2O$, or $N_2$ gas. The first anode electrode ANO1, the insulating layer IN3, and the pixel contact hole PH through which part of the drain electrode DD of the driving TFT DT is exposed are formed by patterning the transparent conductive material and the insulating material using an eleventh mask process. The first anode electrode ANO1 and the insulating layer IN3 are formed to overlap the emission area AA.

The eleventh mask process may be performed through twice etch processes. The first anode electrode ANO1 and the insulating layer IN3 are formed to overlap the emission area AA by patterning the transparent conductive material and the insulating material using a primary wet etch process. In this case, part of the passivation layer IN2 exposed by the overcoat layer OC is partially etched (i.e., half etch) (refer to ① of FIG. 10I). Next, the pixel contact hole PH is formed to expose part of the drain electrode DD of the driving TFT DT through a secondary dry etch process (refer to ② of FIG. 10I). In some embodiments, the first anode electrode ANO1, the insulating layer IN3, and the pixel contact hole PH through which part of the drain electrode DD of the driving TFT DT is exposed may be formed through a single wet etch process. In this case, there may be problems in that the pixel contact hole PH is formed excessively widely and an unnecessary part under the drain electrode DD is etched due to an undercut attributable to wet etch. Accordingly, the eleventh mask process may be performed through twice etch processes.

In the drawings, a structure in which a pair of the first anode electrode ANO1 and the insulating layer IN3 has been formed has been illustrated. In some embodiments, one or more pairs of the first anode electrode ANO1 and the insulating layer IN3 may be stacked and formed. Furthermore, the first anode electrode ANO1 and the insulating layer IN3 may be selectively formed in part of the pixel area. That is, the first anode electrode ANO1 and the insulating layer IN3 may be selectively formed only in a pixel area which requires an improved light efficiency and a color gamut.

Figure 10J:
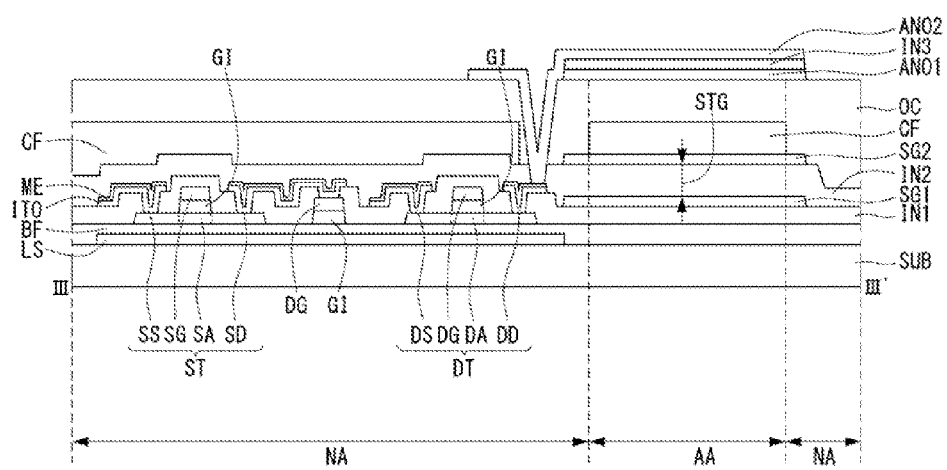

Referring to FIG. 10J, a transparent conductive material is coated on the entire surface of the substrate SUB in which the pixel contact hole PH and the insulating layer IN3 have been formed. The second anode electrode ANO2 is formed by patterning the transparent conductive material using a twelfth mask process. The second anode electrode ANO2 comes in contact with the drain electrode DD of the driving TFT DT through the pixel contact hole PH. In this case, the second anode electrode ANO2 may also come in contact with the first anode electrode ANO1. Furthermore, although not shown in the cross-sectional views, the second anode electrode ANO2 comes in contact with the second storage capacitor electrode SG2 through the storage capacitor contact hole SGH (refer to FIG. 8). Accordingly, the drain electrode DD of the driving TFT DT, the second anode electrode ANO2, and the second storage capacitor electrode SG2 are electrically connected.

In the OLED display according to the second embodiment of the present invention, a dielectric Bragg mirror effect is generated because two or more layers made of materials having different refractive indices are alternately stacked. That is, the second embodiment of the present invention may provide the OLED display in which constructive interference and destructive interference are generated between the first anode electrode ANO1, the insulating layer IN3, and the second anode electrode ANO2 and thus light efficiency and a color gamut have been improved because the first anode electrode ANO1, the insulating layer IN3, and the second anode electrode ANO2 having different refractive indices are sequentially stacked. Furthermore, the second embodiment of the present invention may provide the OLED display in which the color viewing angle is not reduced while improving light efficiency unlike in a resonant effect attributable to a micro cavity because the dielectric Bragg mirror effect is used. For example, the first anode electrode ANO1 and the second anode electrode ANO2 may be made of ITO having a refractive index of 2.0, and the insulating layer IN3 may be made of SiO2 having a refractive index of 1.5. The dielectric Bragg mirror effect can be generated by stacking materials having different refractive indices between adjacent layers as described above.

Next, referring back to FIG. 9, an insulating material is coated on the entire surface of the substrate SUB in which the second anode electrode ANO2 has been formed. The bank BN is formed by patterning the insulating material. The bank BN defines an open area which will actually become the emission area AA and may have a shape in which an area that belongs to the second anode electrode ANO2 and that will emit light is open. The organic emission layer OLE is formed to cover the second anode electrode ANO2 open by the bank BN. The cathode electrode CAT is formed on the entire surface of the substrate SUB including the organic emission layer OLE. Accordingly, the OLED, including the second anode electrode ANO2, the organic emission layer OLE, and the cathode electrode CAT, is completed.

The OLED display according to the second embodiment of the present invention can secure a sufficient storage capacitor STG because the first storage capacitor electrode SG1 and the second storage capacitor electrode SG2 can be formed to have a wide area without a reduction of the aperture ratio in the emission area AA. As a result, if the driving TFT DT is an off state, the OLED display can maintain pixel data until a next period using charges filled in the sufficiently secured storage capacitor STG.

Furthermore, the second embodiment of the present invention may provide the OLED display having an improved light efficiency and a color gamut while preventing a reduction of the color viewing angle because a dielectric Bragg mirror effect is generated on the upper side and at the same time a weak cavity effect is generated on the lower side.

Figure 11A:
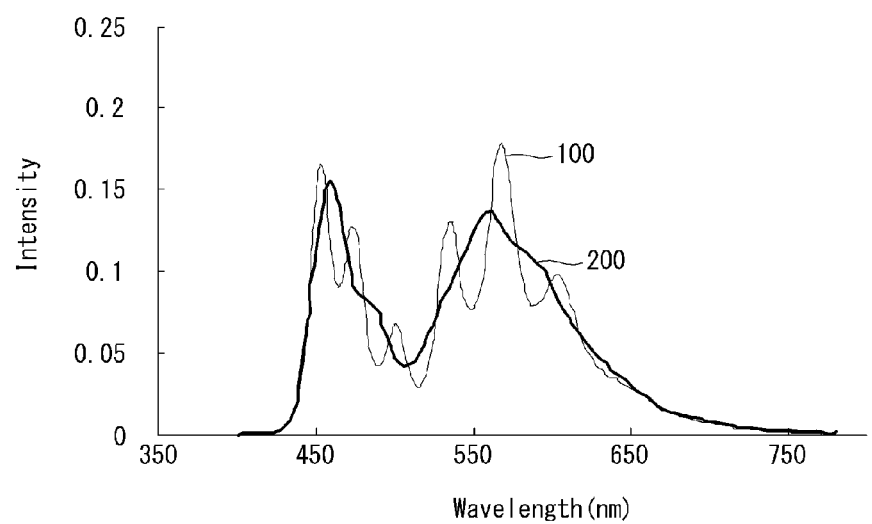
FIG. 11A is a graph illustrating an effect according to the first embodiment of the present invention.
Figure 11B:
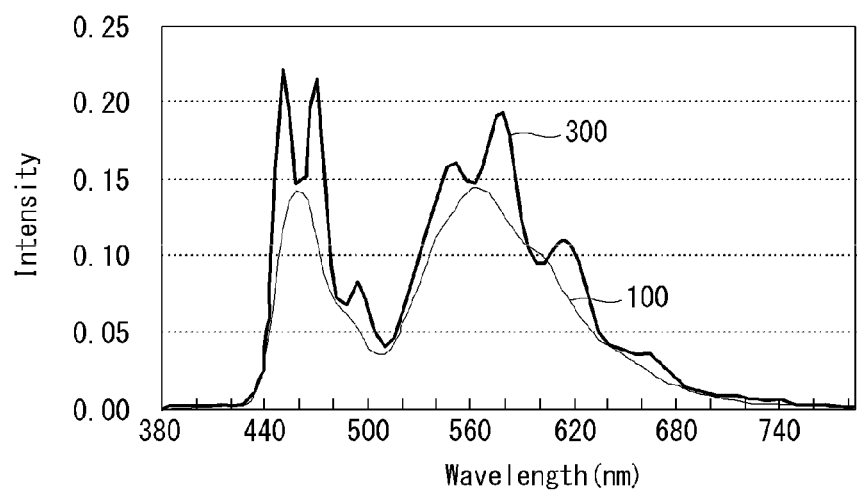
FIG. 11B is a graph illustrating an effect according to the second embodiment of the present invention.

The effects of the OLED displays according to the embodiments of the present invention are described below through the results of spectrum analysis experiments. FIG. 11A is a graph illustrating an effect according to the first embodiment of the present invention. FIG. 11B is a graph illustrating an effect according to the second embodiment of the present invention. In FIGS. 11A and 11B, a horizontal axis denotes a wavelength of a visible ray zone, and a vertical axis denotes light intensity. Furthermore, in the graphs, a thin line 100 shows a distribution of spectra in the OLED display not including the first storage capacitor electrode/passivation layer/second storage capacitor electrode structure and the first anode electrode/insulating layer/second anode electrode structure in accordance with a conventional OLED display.

In FIG. 11A, a thick line 200 shows a distribution of spectra in the OLED display having the first storage capacitor electrode/passivation layer/second storage capacitor electrode structure in accordance with the first embodiment of the present invention. Referring to FIG. 11A, a total area occupied by the thick line 200 is wider than a total area occupied by the thin line 100. The area occupied by the line denotes light efficiency. It may be seen that the OLED display according to the first embodiment has higher light efficiency than the conventional OLED display.

In FIG. 11B, a thick line 300 shows a distribution of spectra in the OLED display having a multi-mode cavity structure in accordance with the second embodiment of the present invention. Referring to FIG. 11B, a total area occupied by the thick line 300 is wider than a total area occupied by the thin line 100. Furthermore, the total area occupied by the thick line 300 is also wider than the thick line 200 of FIG. 11A. Accordingly, it may be seen that the OLED display according to the second embodiment of the present invention has higher light efficiency than the OLED display according to the first embodiment of the present invention in addition to the conventional OLED display.

An OLED display having a micro-cavity structure according to the related art may increase light efficiency through a resonant effect, but has a narrow viewing angle because a spectrum bandwidth is narrowed. In contrast, in the OLED display having a multi-mode cavity structure in accordance with the second embodiment of the present invention, the bandwidth of a spectrum is not narrowed as shown in FIG. 11B. Accordingly, the second embodiment of the present invention may provide the OLED display having improved light efficiency while preventing a reduction of the viewing angle because the bandwidth of a spectrum is not narrowed.

Third Embodiment

The third embodiment of the present invention provides an OLED display having an improved light efficiency and color gamut in forming a storage capacitor using transparent storage capacitor electrodes. That is, the third embodiment of the present invention provides an OLED display having a multi-mode cavity structure. In particular, the third embodiment of the present invention provides a method of manufacturing an OLED display having a reduced number of mask processes compared to the first embodiment and the second embodiment.

The final structure of the OLED display according to the third embodiment of the present invention is substantially the same as the structure of the OLED display according to the second embodiment. Accordingly, hereinafter, a description of the structure of the OLED display shown in FIGS. 8 and 9 is omitted, and only another method of manufacturing the OLED display is described.

A process of manufacturing the OLED display according to the third embodiment of the present invention is described in detail below with reference to FIGS. 12A to 12I and 13A to 13E. FIGS. 12A to 12I are cross-sectional views showing the method of manufacturing the OLED display according to the third embodiment of the present invention.

Figure 12A:
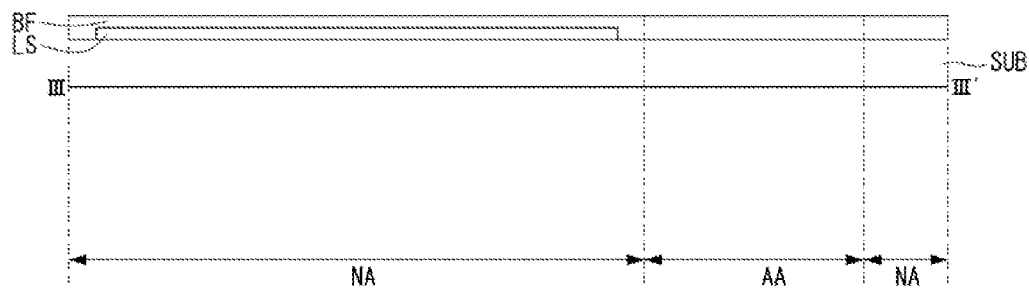
FIGS. 12A to 12I are cross-sectional views showing a method of manufacturing an OLED display according to a third embodiment of the present invention.

Referring to FIG. 12A, an opaque metal material is coated on the entire surface of a substrate SUB. A light-shield layer LS is formed by patterning the metal material using a first mask process. The light-shield layer LS may be formed to overlap the semiconductor layers of TFTs to be formed later, in particular, channel layers. The light-shield layer LS functions to protect an oxide semiconductor device against external light. A buffer layer BF is formed by coating an insulating material on the entire surface of the substrate SUB on which the light-shield layer LS has been formed.

Figure 12B:
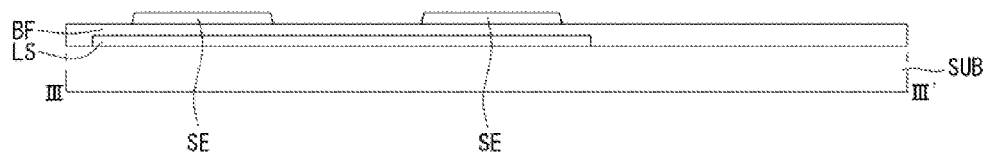

Referring to FIG. 12B, a semiconductor material is coated on the entire surface of the substrate SUB on which the buffer layer BF has been formed. The semiconductor material may include an oxide semiconductor material, such as indium gallium zinc oxide (IGZO). Semiconductor layers SE are formed by patterning the semiconductor material using a second mask process.

Figure 12C:
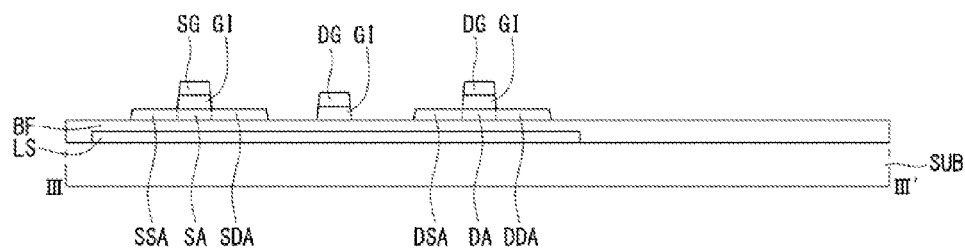

Referring to FIG. 12C, an insulating material and a metal material are continuously formed on the entire surface of the substrate SUB in which the semiconductor layers SE have been formed. Gate insulating layers GI and gate electrodes SG and DG overlapping the gate insulating layers GI are formed by simultaneously patterning the insulating material and the metal material using a third mask process. The gate electrodes SG and DG may be formed to overlap the central areas of the semiconductor layers SE and to expose both sides of the semiconductor layers SE. The central areas of the semiconductor layers SE are respectively defined as the channel layer SA of a switching TFT and the channel layer DA of a driving TFT. The exposed semiconductor layers SE become source areas SSA and DSA and drain areas SDA and DDA which come in contact with the source and drain electrodes of the switching TFT and the driving TFT. If the semiconductor material is an oxide semiconductor material, the source areas SSA and DSA and the drain areas SDA and DDA may be conductorized through a plasma processing process.

Figure 12D:
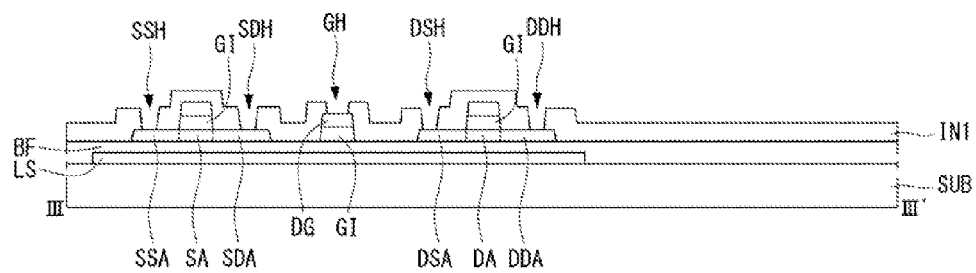

Referring to FIG. 12D, an interlevel insulating layer IN1 is formed by coating an insulating material on the entire surface of the substrate SUB in which the gate electrodes SG and DG have been formed. Contact holes SSH and DSH through which the source areas SSA and DSA of the semiconductor layer are exposed and contact holes SDH and DDH through which the drain areas SDA and DDA of the semiconductor layer are exposed are formed by patterning the interlevel insulating layer IN1 using a fourth mask process. In this case, a gate contact hole GH through which part of the gate electrode DG of the driving TFT is exposed is also formed.

Figure 12E:
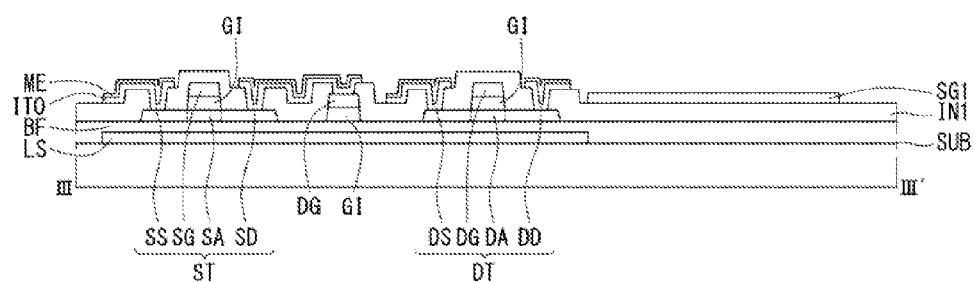

Referring to FIG. 12E, a transparent conductive material and a metal material are continuously coated on the interlevel insulating layer IN1 in which the contact holes have been formed. The transparent conductive material may be a material, such as indium tin oxide, indium zinc oxide, or indium tin zinc oxide. The source electrode SS and drain electrode SD of the switching TFT ST and the source electrode DS and drain electrode DD of the driving TFT DT are formed by patterning the transparent conductive material and the metal material using a fifth mask process. A first storage capacitor electrode SG1 made of only the transparent conductive material is formed in the emission area AA. In this case, the first storage capacitor electrode SG1 is electrically connected to the drain electrode SD of the switching TFT. Furthermore, the drain electrode SD of the switching TFT is connected to the gate electrode DG of the driving TFT.

The fifth mask process is performed using a half-tone mask. Each of the source electrode SS and drain electrode SD of the switching TFT ST and the source electrode DS and drain electrode DD of the driving TFT DT is formed of a dual layer including the transparent conductive material ITO and the metal material ME, and the first storage capacitor electrode SG1 is formed of a single layer including the transparent conductive material ITO, using the half-tone mask.

Figure 12F:
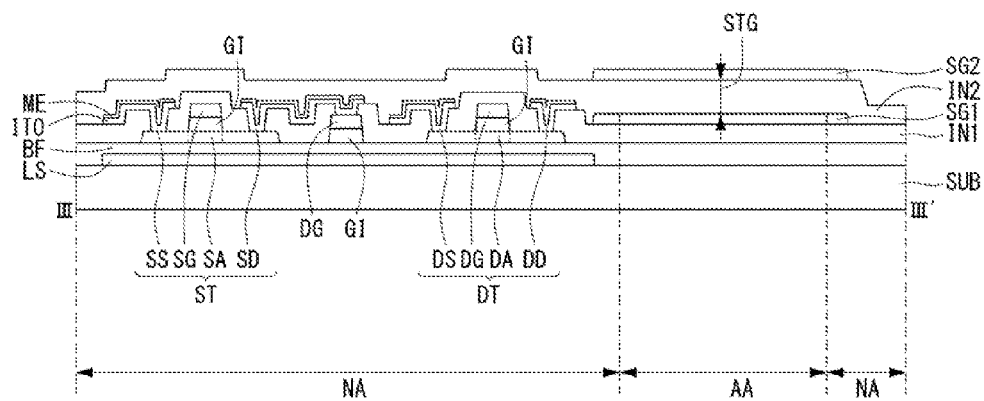

Referring to FIG. 12F, a passivation layer IN2 is formed by coating an insulating material on the entire surface of the substrate SUB in which the TFTs ST and DT have been completed. A transparent conductive material is coated on the passivation layer IN2. A second storage capacitor electrode SG2 is formed by patterning the transparent conductive material using a sixth mask process. The second storage capacitor electrode SG2 may be formed to overlap the first storage capacitor electrode SG1.

In this case, the first storage capacitor electrode SG1 and the second storage capacitor electrode SG2 are formed to overlap each other with the passivation layer IN2 interposed therebetween in the emission area AA. A storage capacitor STG is formed in the area in which the first storage capacitor electrode SG1 and the second storage capacitor electrode SG2 are overlapped. Accordingly, in the OLED display according to the third embodiment of the present invention, the storage capacitor electrodes SG1 and SG2 can be formed in the entire emission area AA without a reduction of the aperture ratio because the storage capacitor electrodes SG1 and SG2 are made of the transparent conductive material. Accordingly, the OLED display according to the third embodiment of the present invention can secure a sufficient storage capacitor STG because the storage capacitor STG having a wide area can be formed.

Furthermore, the OLED display according to the third embodiment of the present invention can improve emission efficiency because the constructive interference and/or destructive interference of light are generated between the first storage capacitor electrode SG1 and the second storage capacitor electrode SG2. That is, in the OLED display according to the third embodiment of the present invention, the first storage capacitor electrode SG1, the passivation layer IN2, and the second storage capacitor electrode SG2 are sequentially stacked. The refractive index of at least any one of the first storage capacitor electrode SG1, the passivation layer IN2, and the second storage capacitor electrode SG2 is different from a refractive index of another of the first storage capacitor electrode SG1, the passivation layer IN2, and the second storage capacitor electrode SG2. Accordingly, emission efficiency and color purity can be improved through a light amplification phenomenon (weak cavity) according to resonance between the layers.

Figure 12G:
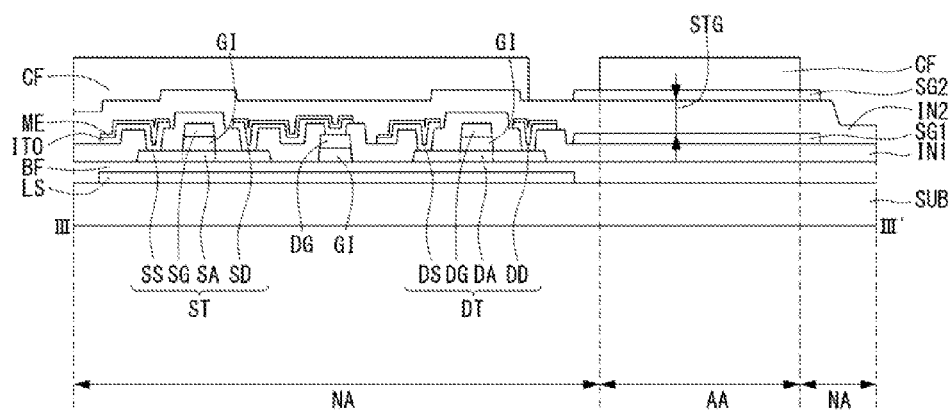

Referring to FIG. 12G, red, green, and blue pigments are coated on the entire surface of the substrate SUB in which the second storage capacitor electrode SG2 has been formed. Red, green, and blue color filters CF are sequentially formed by sequentially patterning the red, green, and blue pigments using respective seventh, eighth, and ninth mask processes. The red, green, and blue color filters CF are selectively formed in a pixel area in which red, green, and blue are respectively to be displayed. In this case, the red color filter CF and/or the green color filter CF may be extended and formed to cover the TFTs ST and DT of the pixel area.

Figure 12H:
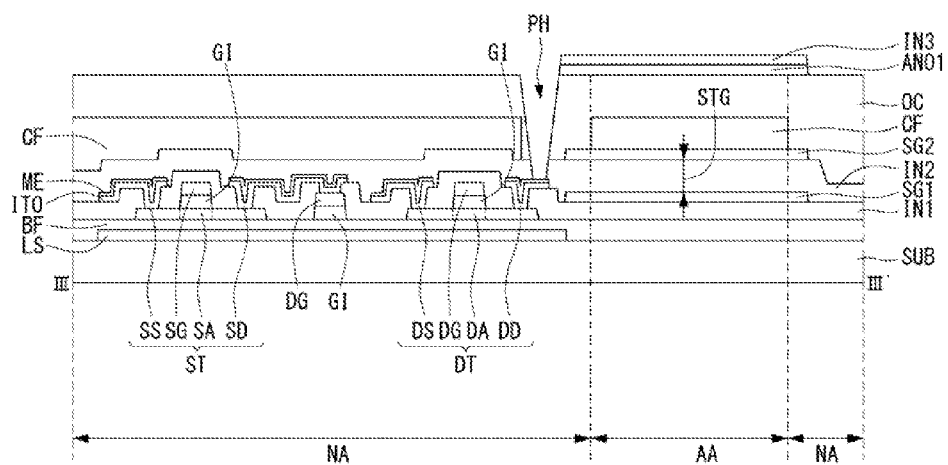

Referring to FIG. 12H, an overcoat layer OC is formed by coating a first insulating material on the entire surface of the substrate SUB in which the color filter CF has been formed. At the same time, a transparent conductive material and a second insulating material are continuously coated on the first insulating material. The second insulating material may include an inorganic insulating material, such as silicon oxide (SiO2), silicon nitride (SiNx), or silicon oxynitride (SiON), but the present invention is not limited thereto. For example, the second insulating material may include all types of insulating materials formed by a CVD process using SiH4, NH3, N2O, or N2 gas.

The overcoat layer OC, the transparent conductive material, and the second insulating material are patterned using a tenth mask process. Since the overcoat layer OC is patterned, a pixel contact hole PH through which part of the drain electrode DD of the driving TFT DT is exposed is formed. Since the transparent conductive material and the second insulating material are patterned, a first anode electrode ANO1 and an insulating layer IN3 are formed. The first anode electrode ANO1 and the insulating layer IN3 are formed to overlap the emission area AA.

The tenth mask process is described in more detail below with further reference to FIGS. 13A to 13e. FIGS. 13A to 13E are detailed diagrams showing a processing process between FIGS. 12G and 12H.

Figure 13A:
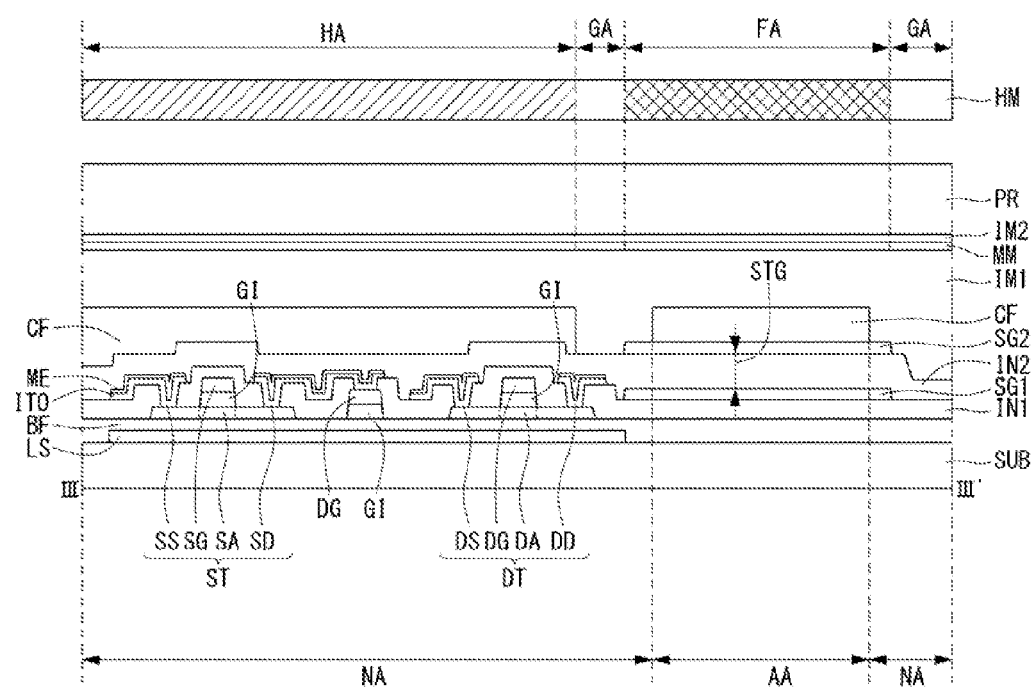
FIGS. 13A to 13E are detailed diagrams showing a processing process between FIGS. 12G and 12H.

Referring to FIG. 13A, the first insulating material IM1, the transparent conductive material MM, and the second insulating material IM2 are sequentially coated on the entire surface of the substrate SUB in which the color filter CF has been formed. A half-tone mask HM is prepared in order to pattern the first insulating material IM1, the transparent conductive material MM, and the second insulating material IM2 using the tenth mask process. The half-tone mask HM includes a full-tone area FA blocking all pieces of radiated light, a half-tone area HA transmitting only some of radiated light and blocking some of the radiated light, and an area GA transmitting all of radiated light. A photoresist film PR made of a photoresist material, such as a photoresist, is formed on the entire surface of the substrate SUB in which the first insulating material IM1, the transparent conductive material MM, and the second insulating material IM2 have been coated. Light is selectively radiated through the prepared half-tone mask HM. The photoresist film PR may be a negative type or a positive type. In the following description, the photoresist film PR is assumed to be a positive type.

Figure 13B:
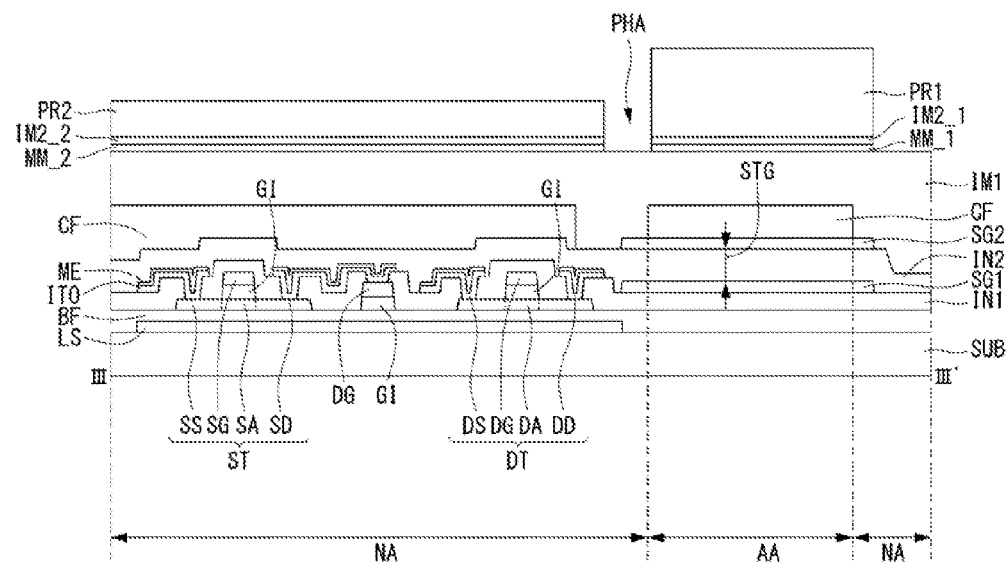

Referring to FIG. 13B, if the photoresist film PR exposed to light through the half-tone mask HM is developed, the photoresist film PR of the area GA transmitting all pieces of light is removed, and the photoresist film PR1 of the full-tone area FA and the photoresist film PR2 of the half-tone area HA remain intact. In this case, the photoresist film PR1 of the full-tone area FA is formed to be thicker than the photoresist film PR2 of the half-tone area HA. Part of the area PHA of the first insulating material IM1 is exposed by simultaneously patterning the second insulating material IM2 and the transparent conductive material MM through a mask process using the remaining photoresist films PR1 and PR2. The exposed part of the area PHA of the first insulating material IM1 is an area in which the pixel contact hole will be formed.

Figure 13C:
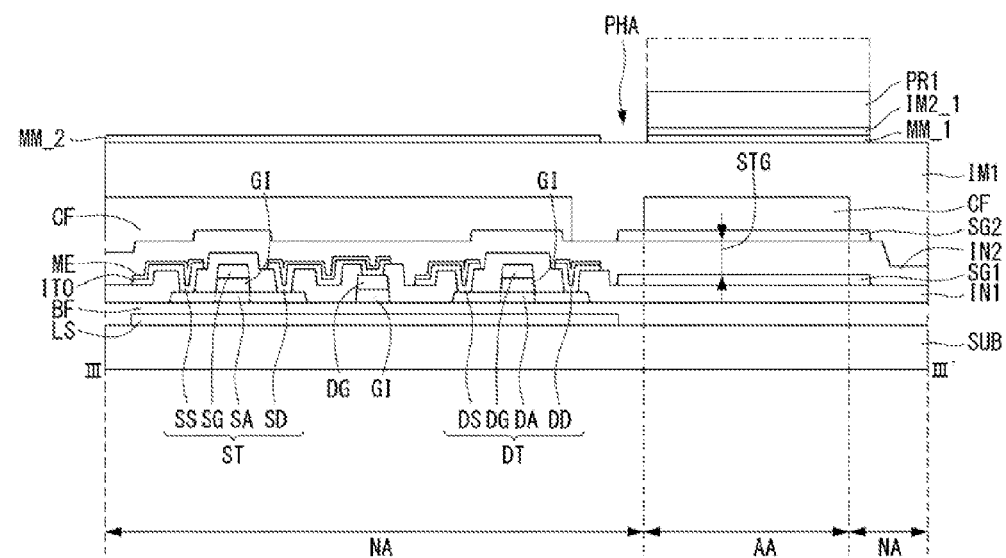

Referring to FIG. 13C, an asking process for removing part of the thickness of the photoresist films PR1 and PR2 is performed so that only the photoresist film PR1 of the full-tone area FA remains intact. A second insulating material IM2_2 remained in the half-tone area HA is removed through a mask process using the remaining photoresist film PR1. A wet etch process may be performed in order to remove the second insulating material IM2_2 remained in the half-tone area HA.

Figure 13D:
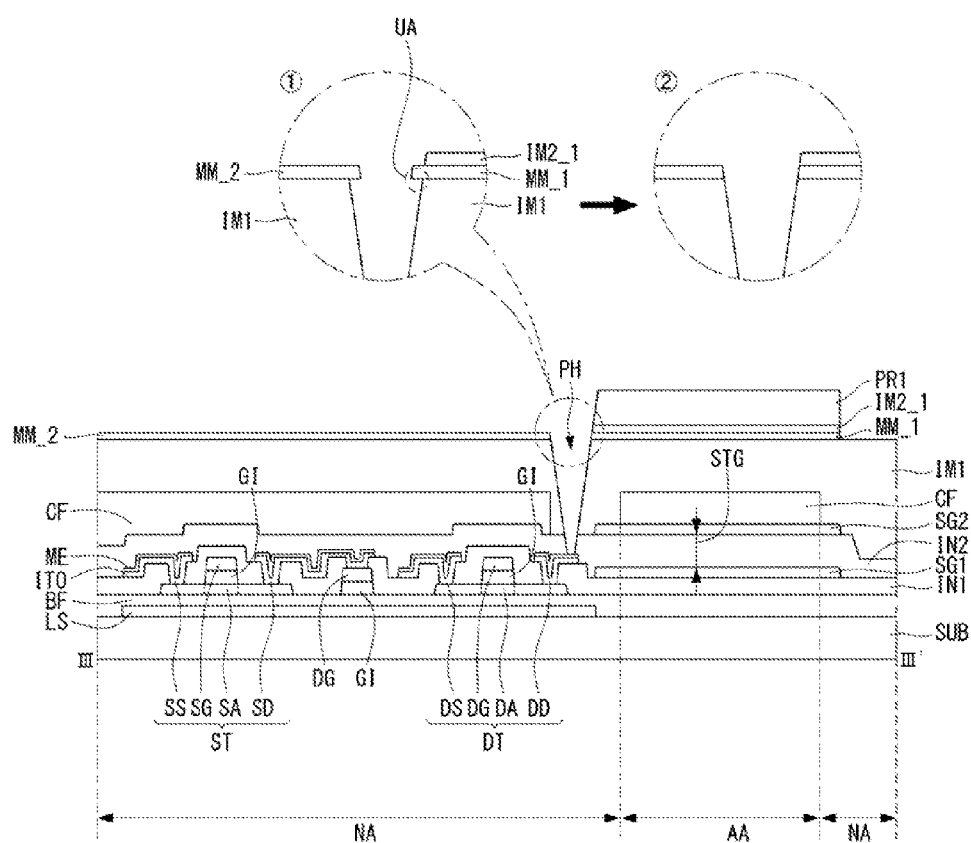

Referring to FIG. 13D, the pixel contact hole PH through which part of the drain electrode DD of the driving TFT DT is exposed is formed by patterning the first insulating material IM1 and the passivation layer IN2 through a mask process using the remaining photoresist film PR1 and the remaining transparent conductive material MM_2 of the half-tone area HA. In order to form the pixel contact hole PH, a dry etch process may be performed. As described above, the remaining transparent conductive material MM_2 of the half-tone area HA functions as a mask. Accordingly, although an etch process for forming the pixel contact hole PH is performed, the first insulating material IM1 under the transparent conductive material MM_2 is not damaged.

In the process of forming the pixel contact hole PH through the etch process, an undercut UA may be generated under the transparent conductive materials MM_1 and MM_2 (refer to ① of FIG. 13D). The generated undercut UA may generate a failure that opens the second anode electrode ANO2 (refer to FIG. 12I) to be formed later. That is, if the undercut is generated, the transparent conductive materials MM_1 and MM_2 are more protruded toward the inside of the pixel contact hole PH than the first insulating material IM1. In this case, a failure in which the second anode electrode ANO2 (refer to FIG. 12I) is open by the protruded transparent conductive material MM_1 may be generated because the second anode electrode ANO2 is deposited on a surface of the pixel contact hole PH and a top surface of the second insulating material IM2. In order to prevent such an open failure, an additional process for removing the protruded transparent conductive material MM_1 may be performed (refer to ② of FIG. 13D). The additional process may be a wet etch process.

Figure 13E:
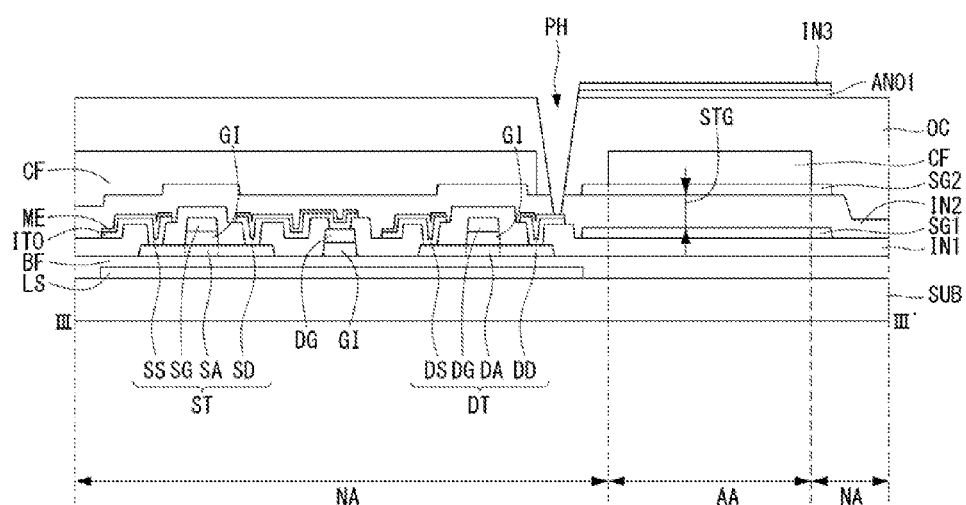

Referring to FIG. 13E, the transparent conductive material MM_2 remained in the half-tone area HA is removed through a mask process using the remaining photoresist film PR1. In order to remove the transparent conductive material MM_2, a wet etch process may be performed. An etchant used in this case has selectivity by which a transparent conductive material, such as ITO, is etched, but a metal material, such as copper (Cu), is not etched. For example, the etchant may be oxalic (Oz) acid series. Accordingly, although the etch process for removing the transparent conductive material MM_2 is performed, the drain electrode DD exposed through the pixel contact hole PH is not damaged. That is, the drain electrode DD exposed through the pixel contact hole PH can be prevented from being damaged by the etchant because it is formed of a dual layer (i.e., ITO and ME) and a metal material, such as Cu, is placed in the upper ME coming into a direct contact with the etchant.

The pixel contact hole PH configured to expose the drain electrode DD through the overcoat layer OC and the first anode electrode ANO1 and the insulating layer IN3 configured to be overlapped in the emission area AA are formed through the tenth mask process. The remaining first insulating material IM1, the transparent conductive material MM_1, and the second insulating material IM2_1 respectively become the overcoat layer OC, the first anode electrode ANO1, and the insulating layer IN3 through the tenth mask process.

In the figures, a structure in which a pair of the first anode electrode ANO1 and the insulating layer IN3 has been formed has been illustrated. In some embodiments, one or more pairs of the first anode electrode ANO1 and the insulating layer IN3 may be stacked. Furthermore, the first anode electrode ANO1 and the insulating layer IN3 may be selectively formed only in some pixel area. That is, the first anode electrode ANO1 and the insulating layer IN3 may be selectively formed only in a pixel area which requires an improved light efficiency and color gamut.

Figure 12I:
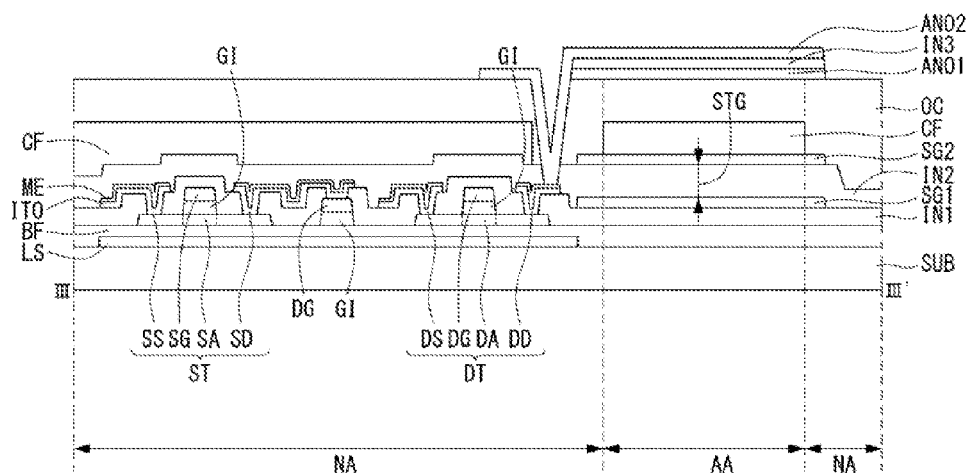

Referring to FIG. 12I, a transparent conductive material is coated on the entire surface of the substrate SUB in which the pixel contact hole PH and the insulating layer IN3 have been formed. A second anode electrode ANO2 is formed by patterning the transparent conductive material using a twelfth mask process. The second anode electrode ANO2 comes in contact with the drain electrode DD of the driving TFT DT through the pixel contact hole PH. In this case, the second anode electrode ANO2 may also come in contact with the first anode electrode ANO1.

In the OLED display according to the third embodiment of the present invention, a dielectric Bragg mirror effect is generated because two or more layers made of materials having different refractive indices are alternately stacked. That is, the third embodiment of the present invention may provide an OLED display in which constructive interference and destructive interference are generated between the first anode electrode ANO1, the insulating layer IN3, and the second anode electrode ANO2 and thus light efficiency and a color gamut are improved because the first anode electrode ANO1, the insulating layer IN3, and the second anode electrode ANO2 having different refractive indices are sequentially stacked. Furthermore, the third embodiment of the present invention may provide an OLED display not having a reduced color viewing angle while improving light efficiency unlike in a resonant effect according to a micro cavity using the dielectric Bragg mirror effect. For example, the first anode electrode ANO1 and the second anode electrode ANO2 may be made of ITO having a refractive index of 2.0, and the insulating layer IN3 may be made of SiO2 having a refractive index of 1.5. The dielectric Bragg mirror effect can be generated because materials having different refractive indices are stacked between adjacent layers as described above.

Next, referring back to FIG. 9, an insulating material is coated on the entire surface of the substrate SUB in which the second anode electrode ANO2 has been formed. A bank BN is formed by patterning the insulating material. The bank BN defines an open area that will actually become the emission area AA. The bank BN may have a shape in which an area that belongs to the second anode electrode ANO2 and that will emit light is open. The organic emission layer OLE is formed to cover the second anode electrode ANO2 open by the bank BN. The cathode electrode CAT is formed on the entire surface of the substrate SUB including the organic emission layer OLE. Accordingly, the OLED, including the second anode electrode ANO2, the organic emission layer OLE, and the cathode electrode CAT, is completed.

The OLED display according to the third embodiment of the present invention can secure a sufficient storage capacitor STG because the first storage capacitor electrode SG1 and the second storage capacitor electrode SG2 can be formed to have a wide area without a reduction of the aperture ratio in the emission area AA. As a result, if the driving TFT DT is an off state, the OLED display can maintain pixel data until a next period using charges charged in the sufficiently secured storage capacitor STG.

Furthermore, the third embodiment of the present invention may provide an OLED display having an improved light efficiency and color gamut while preventing a reduction of the color viewing angle because a dielectric Bragg mirror effect is generated on the upper side and at the same time a weak cavity effect is generated on the lower side.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light-emitting diode (OLED) display, comprising:
a substrate configured to have an emission area and a non-emission area defined in the substrate;
a thin film transistor disposed in the non-emission area;
a first storage capacitor electrode and a second storage capacitor electrode configured to be overlapped in the emission area with a passivation layer interposed between the first and second storage capacitor electrodes;
an overcoat layer configured to cover the thin film transistor and the second storage capacitor electrode; and
a first pixel area including a first anode electrode, a second anode electrode, and an insulating layer, the first anode electrode and the insulating layer being sequentially stacked on the overcoat layer in such a way as to overlap the second storage capacitor electrode, and the second anode electrode being disposed on the insulating layer and being in contact with the thin film transistor and the first anode electrode, wherein the insulating layer is a continuous sheet that covers the entire first anode electrode.

2. The OLED display of claim 1, further comprising a second pixel area configured to include the second anode electrode disposed on the overcoat layer and connected to the thin film transistor.

3. The OLED display of claim 1, wherein a plurality of the stacked first anode electrode and insulating layer are provided, and are alternately stacked.

4. The OLED display of claim 1, wherein the first storage capacitor electrode, the second storage capacitor electrode, the first anode electrode, and the second anode electrode are made of a transparent conductive material.

5. The OLED display of claim 1, wherein the insulating layer is made of an inorganic insulating material.

6. The OLED display of claim 1, wherein a refractive index of at least any one of the first storage capacitor electrode, the passivation layer, and the second storage capacitor electrode is different from a refractive index of another of the first storage capacitor electrode, the passivation layer, and the second storage capacitor electrode.

7. The OLED display of claim 1, wherein a refractive index of at least any one of the first anode electrode, the insulating layer, and the second anode electrode is different from a refractive index of another of the first anode electrode, the insulating layer, and the second anode electrode.

8. The OLED display of claim 1, further comprising a bank formed to expose the second anode electrode,
wherein the insulating layer contacts the bank.

9. The OLED display of claim 1, further comprising a color filter disposed in the emission area,
wherein the color filter contacts the second storage capacitor electrode.

10. The OLED display of claim 1, wherein the first storage capacitor electrode, the second storage capacitor electrode, the first anode electrode, the second anode electrode, and the insulating layer are aligned in the emission area.

* * * * *